US010593377B2

(12) United States Patent
Wheeler et al.

(10) Patent No.: US 10,593,377 B2
(45) Date of Patent: Mar. 17, 2020

(54) MULTIPLE ENDIANNESS COMPATIBILITY

(71) Applicant: Micron Technology, Inc., Boise, ID (US)

(72) Inventors: Kyle B. Wheeler, Meridian, ID (US); Timothy P. Finkbeiner, Boise, ID (US); Jeremiah J. Willcock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/219,569

(22) Filed: Dec. 13, 2018

(65) Prior Publication Data

US 2019/0122706 A1    Apr. 25, 2019

Related U.S. Application Data

(63) Continuation of application No. 14/885,546, filed on Oct. 16, 2015, now Pat. No. 10,163,467.

(60) Provisional application No. 62/064,561, filed on Oct. 16, 2014.

(51) Int. Cl.
    *G11C 7/10*        (2006.01)
(52) U.S. Cl.
    CPC .......... *G11C 7/1012* (2013.01); *G11C 7/1006* (2013.01)
(58) Field of Classification Search
    CPC ..................... G11C 7/1012; G11C 7/1006
    See application file for complete search history.

(56) References Cited

U.S. PATENT DOCUMENTS

| 3,988,601 | A | * | 10/1976 | Perry | G06F 7/76 377/55 |
| 4,380,046 | A | ‡ | 4/1983 | Frosch | G06F 15/8007 712/11 |
| 4,435,792 | A | ‡ | 3/1984 | Bechtolsheim | G09G 5/393 348/71 |
| 4,435,793 | A | ‡ | 3/1984 | Ochii | G11C 5/063 365/19 |
| 4,727,474 | A | ‡ | 2/1988 | Batcher | G06F 15/8007 712/14 |
| 4,843,264 | A | ‡ | 6/1989 | Galbraith | G01R 19/155 327/21 |

(Continued)

FOREIGN PATENT DOCUMENTS

| CN | 102141905 | ‡ | 8/2011 |
| EP | 0214718 | ‡ | 3/1987 |

(Continued)

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.‡

(Continued)

*Primary Examiner* — Eric Cardwell
(74) *Attorney, Agent, or Firm* — Brooks, Cameron & Huebsch, PLLC

(57) ABSTRACT

Examples of the present disclosure provide apparatuses and methods for multiple endianness compatibility. An example method comprises receiving a plurality of bytes in a non-bit-sequential format. The method includes reordering the bits in each byte of the plurality of bytes such that the plurality of bytes are arranged in a bit-sequential format.

20 Claims, 7 Drawing Sheets

(56) References Cited

U.S. PATENT DOCUMENTS

| | | | | |
|---|---|---|---|---|
| 4,958,378 A | ‡ | 9/1990 | Bell | G09G 5/006 345/27 |
| 4,977,542 A | ‡ | 12/1990 | Matsuda | G11C 7/14 365/14 |
| 5,023,838 A | ‡ | 6/1991 | Herbert | G09G 5/393 326/10 |
| 5,034,636 A | ‡ | 7/1991 | Reis | G06F 12/0895 326/55 |
| 5,201,039 A | ‡ | 4/1993 | Sakamura | G06F 9/30101 711/20 |
| 5,210,850 A | ‡ | 5/1993 | Kelly | G06F 12/0888 710/22 |
| 5,253,308 A | ‡ | 10/1993 | Johnson | G06T 1/20 382/30 |
| 5,276,643 A | ‡ | 1/1994 | Hoffmann | G11C 7/1006 365/18 |
| 5,325,519 A | ‡ | 6/1994 | Long | G06F 3/0601 714/15 |
| 5,367,488 A | ‡ | 11/1994 | An | G11C 7/18 365/18 |
| 5,379,257 A | ‡ | 1/1995 | Matsumura | G11C 7/1006 365/18 |
| 5,386,379 A | ‡ | 1/1995 | Ali-Yahia | G11C 15/04 365/15 |
| 5,398,213 A | ‡ | 3/1995 | Yeon | G11C 7/1021 365/18 |
| 5,440,482 A | ‡ | 8/1995 | Davis | G06F 7/02 715/22 |
| 5,446,690 A | ‡ | 8/1995 | Tanaka | G11C 16/10 365/18 |
| 5,473,576 A | ‡ | 12/1995 | Matsui | G11C 7/1048 365/14 |
| 5,481,500 A | ‡ | 1/1996 | Reohr | G11C 7/065 365/18 |
| 5,485,373 A | ‡ | 1/1996 | Davis | G06F 7/02 715/20 |
| 5,506,811 A | ‡ | 4/1996 | McLaury | G11C 7/06 365/14 |
| 5,519,842 A | ‡ | 5/1996 | Atallah | G06F 9/34 711/14 |
| 5,615,404 A | ‡ | 3/1997 | Knoll | G06F 13/423 710/11 |
| 5,638,128 A | ‡ | 6/1997 | Hoogenboom | H04N 19/61 348/71 |
| 5,638,317 A | ‡ | 6/1997 | Tran | G11C 7/10 365/18 |
| 5,654,936 A | ‡ | 8/1997 | Cho | G11C 7/1051 365/19 |
| 5,678,021 A | ‡ | 10/1997 | Pawate | G06F 15/7821 711/10 |
| 5,724,291 A | ‡ | 3/1998 | Matano | G11C 7/10 365/20 |
| 5,724,366 A | ‡ | 3/1998 | Furutani | G11C 29/38 365/20 |
| 5,751,987 A | ‡ | 5/1998 | Mahant-Shetti | G06F 9/3879 365/23 |
| 5,781,923 A | ‡ | 7/1998 | Hunt | G06F 13/4013 711/12 |
| 5,787,458 A | ‡ | 7/1998 | Miwa | G11C 15/04 365/49 |
| 5,854,636 A | ‡ | 12/1998 | Watanabe | G06F 17/10 345/51 |
| 5,867,429 A | ‡ | 2/1999 | Chen | G11C 11/5621 |
| 5,870,504 A | ‡ | 2/1999 | Nemoto | G06K 9/44 382/26 |
| 5,915,084 A | ‡ | 6/1999 | Wendell | G11C 7/06 365/20 |
| 5,935,263 A | ‡ | 8/1999 | Keeth | G11C 29/38 714/71 |
| 5,986,942 A | ‡ | 11/1999 | Sugibayashi | G11C 7/065 365/18 |
| 5,991,209 A | ‡ | 11/1999 | Chow | G11C 7/065 365/18 |
| 5,991,785 A | ‡ | 11/1999 | Alidina | G06F 7/544 708/20 |
| 6,005,799 A | ‡ | 12/1999 | Rao | G11C 11/565 365/14 |
| 6,009,020 A | ‡ | 12/1999 | Nagata | G11C 7/1006 365/18 |
| 6,092,186 A | ‡ | 7/2000 | Betker | G06F 9/3804 710/22 |
| 6,122,211 A | ‡ | 9/2000 | Morgan | G11C 7/06 365/14 |
| 6,125,071 A | ‡ | 9/2000 | Kohno | G11C 8/10 365/23 |
| 6,134,164 A | ‡ | 10/2000 | Lattimore | G11C 7/065 365/19 |
| 6,147,514 A | ‡ | 11/2000 | Shiratake | G11C 7/06 327/55 |
| 6,151,244 A | ‡ | 11/2000 | Fujino | G11C 11/401 365/14 |
| 6,157,578 A | ‡ | 12/2000 | Brady | G11C 7/065 365/18 |
| 6,163,862 A | ‡ | 12/2000 | Adams | G11C 29/02 365/20 |
| 6,166,942 A | ‡ | 12/2000 | Vo | G11C 7/10 365/18 |
| 6,172,918 B1 | ‡ | 1/2001 | Hidaka | G11C 7/1012 365/18 |
| 6,175,514 B1 | ‡ | 1/2001 | Henderson | G11C 7/1075 365/15 |
| 6,181,698 B1 | ‡ | 1/2001 | Hariguchi | G11C 15/04 370/39 |
| 6,208,544 B1 | ‡ | 3/2001 | Beadle | G11C 15/00 365/18 |
| 6,226,215 B1 | ‡ | 5/2001 | Yoon | G11C 7/1048 365/18 |
| 6,301,153 B1 | ‡ | 10/2001 | Takeuchi | G11C 16/0483 365/18 |
| 6,301,164 B1 | ‡ | 10/2001 | Manning | G11C 29/785 365/20 |
| 6,304,477 B1 | ‡ | 10/2001 | Naji | G11C 15/02 365/15 |
| 6,389,507 B1 | ‡ | 5/2002 | Sherman | H04L 45/7453 707/99 |
| 6,418,498 B1 | ‡ | 7/2002 | Martwick | G06F 9/4812 710/26 |
| 6,466,499 B1 | ‡ | 10/2002 | Blodgett | G11C 7/065 365/20 |
| 6,510,098 B1 | ‡ | 1/2003 | Taylor | G11C 8/16 365/18 |
| 6,563,754 B1 | ‡ | 5/2003 | Lien | G11C 11/4125 365/22 |
| 6,578,058 B1 | ‡ | 6/2003 | Nygaard, Jr. | G01R 31/3177 340/14 |
| 6,731,542 B1 | ‡ | 5/2004 | Le | G11C 16/0491 365/18 |
| 6,754,746 B1 | ‡ | 6/2004 | Leung | G06F 13/40 365/20 |
| 6,768,679 B1 | ‡ | 7/2004 | Le | G11C 16/0491 365/18 |
| 6,807,614 B2 | ‡ | 10/2004 | Chung | G06F 9/3879 711/16 |
| 6,816,422 B2 | ‡ | 11/2004 | Hamade | G11C 29/34 365/18 |
| 6,819,612 B1 | ‡ | 11/2004 | Achter | G11C 7/065 365/18 |
| 6,894,549 B2 | ‡ | 5/2005 | Eliason | G11C 11/22 327/21 |
| 6,943,579 B1 | ‡ | 9/2005 | Hazanchuk | G06F 7/523 326/39 |
| 6,948,056 B1 | ‡ | 9/2005 | Roth | G06F 7/22 708/20 |
| 6,950,771 B1 | ‡ | 9/2005 | Fan | G01R 31/2894 702/11 |
| 6,950,898 B2 | ‡ | 9/2005 | Merritt | G11C 7/1036 365/63 |

(56) References Cited

U.S. PATENT DOCUMENTS

| | | | | |
|---|---|---|---|---|
| 6,956,770 B2 ‡ | 10/2005 | Khalid | G11C 16/0483 | 365/18 |
| 6,961,272 B2 ‡ | 11/2005 | Schreck | G11C 7/06 | 365/19 |
| 6,965,648 B1 ‡ | 11/2005 | Smith | G01R 31/3185 | 375/22 |
| 6,985,394 B2 ‡ | 1/2006 | Kim | G11C 7/12 | 365/20 |
| 6,987,693 B2 ‡ | 1/2006 | Cernea | G11C 8/08 | 365/18 |
| 7,020,017 B2 ‡ | 3/2006 | Chen | G11C 16/3459 | 365/18 |
| 7,028,170 B2 ‡ | 4/2006 | Saulsbury | G06F 9/30021 | 712/22 |
| 7,045,834 B2 ‡ | 5/2006 | Tran | H01L 27/10808 | 257/20 |
| 7,054,178 B1 ‡ | 5/2006 | Shiah | G11C 5/025 | 365/51 |
| 7,061,817 B2 ‡ | 6/2006 | Raad | G11C 29/40 | 365/19 |
| 7,079,407 B1 ‡ | 7/2006 | Dimitrelis | G11C 15/04 | 365/18 |
| 7,173,857 B2 ‡ | 2/2007 | Kato | G11C 11/5628 | 365/18 |
| 7,187,585 B2 ‡ | 3/2007 | Li | G11C 11/5642 | 365/18 |
| 7,196,928 B2 ‡ | 3/2007 | Chen | G11C 16/3459 | 365/18 |
| 7,260,565 B2 ‡ | 8/2007 | Lee | H04L 12/56 | |
| 7,260,672 B2 ‡ | 8/2007 | Garney | G06F 21/79 | 705/51 |
| 7,372,715 B2 ‡ | 5/2008 | Han | G11C 7/02 | 365/20 |
| 7,400,532 B2 ‡ | 7/2008 | Aritome | G11C 11/5628 | 365/18 |
| 7,406,494 B2 ‡ | 7/2008 | Magee | G06F 7/768 | 708/40 |
| 7,447,720 B2 ‡ | 11/2008 | Beaumont | G06F 9/3001 | 708/20 |
| 7,454,451 B2 ‡ | 11/2008 | Beaumont | G06F 9/3001 | 708/20 |
| 7,457,181 B2 ‡ | 11/2008 | Lee | G11C 7/065 | 365/18 |
| 7,535,769 B2 ‡ | 5/2009 | Cernea | G11C 7/02 | 365/18 |
| 7,546,438 B2 ‡ | 6/2009 | Chung | G06F 9/3001 | 711/20 |
| 7,562,198 B2 ‡ | 7/2009 | Noda | G11C 7/1006 | 711/15 |
| 7,574,466 B2 ‡ | 8/2009 | Beaumont | G06F 15/8023 | 708/20 |
| 7,602,647 B2 ‡ | 10/2009 | Li | G11C 11/5628 | 365/18 |
| 7,663,928 B2 ‡ | 2/2010 | Tsai | G11C 7/065 | 327/57 |
| 7,692,466 B2 ‡ | 4/2010 | Ahmadi | G11C 7/062 | 327/21 |
| 7,685,365 B2 ‡ | 5/2010 | Rajwar | G06F 9/467 | 711/11 |
| 7,752,417 B2 ‡ | 7/2010 | Manczak | G06F 11/3466 | 711/20 |
| 7,791,962 B2 ‡ | 9/2010 | Noda | G11C 7/1006 | 365/18 |
| 7,796,453 B2 ‡ | 9/2010 | Riho | G11C 7/1048 | 365/20 |
| 7,805,587 B1 ‡ | 9/2010 | Van Dyke | G06F 12/10 | 711/20 |
| 7,808,854 B2 ‡ | 10/2010 | Takase | G11C 7/065 | 365/18 |
| 7,827,372 B2 ‡ | 11/2010 | Bink | G11C 29/76 | 711/11 |
| 7,869,273 B2 ‡ | 1/2011 | Lee | G11C 11/5628 | 365/18 |
| 7,898,864 B2 ‡ | 3/2011 | Dong | G11C 11/5628 | 365/18 |
| 7,924,628 B2 ‡ | 4/2011 | Danon | G11C 11/5628 | 365/18 |
| 7,937,535 B2 ‡ | 5/2011 | Ozer | G06F 12/0822 | 711/14 |
| 7,957,206 B2 ‡ | 6/2011 | Bauser | G11C 7/067 | 365/17 |
| 7,979,667 B2 ‡ | 7/2011 | Allen | G06F 12/0246 | 711/20 |
| 7,996,749 B2 ‡ | 8/2011 | Ding | H04L 25/45 | 327/23 |
| 8,042,082 B2 ‡ | 10/2011 | Solomon | G06F 17/5045 | 365/12 |
| 8,045,391 B2 ‡ | 10/2011 | Mokhlesi | G11C 16/26 | 365/18 |
| 8,059,438 B2 ‡ | 11/2011 | Chang | G11C 7/1006 | 365/14 |
| 8,095,825 B2 ‡ | 1/2012 | Hirotsu | G06F 11/1407 | 714/15 |
| 8,117,462 B2 ‡ | 2/2012 | Snapp | G06Q 10/08 | 713/18 |
| 8,164,942 B2 ‡ | 4/2012 | Gebara | G11C 7/00 | 365/14 |
| 8,208,328 B2 ‡ | 6/2012 | Hong | G11C 7/1048 | 365/18 |
| 8,213,248 B2 ‡ | 7/2012 | Moon | G11C 11/4096 | 365/20 |
| 8,223,568 B2 ‡ | 7/2012 | Seo | G11C 5/025 | 365/19 |
| 8,238,173 B2 ‡ | 8/2012 | Akerib | G11C 29/34 | 365/18 |
| 8,274,841 B2 ‡ | 9/2012 | Shimano | G11C 8/04 | 365/18 |
| 8,279,683 B2 ‡ | 10/2012 | Klein | G11C 7/1006 | 365/18 |
| 8,310,884 B2 ‡ | 11/2012 | Iwai | G11C 11/4076 | 365/18 |
| 8,332,367 B2 ‡ | 12/2012 | Bhattacherjee | G06F 16/24556 | 707/69 |
| 8,339,824 B2 ‡ | 12/2012 | Cooke | G06K 9/6276 | 365/49 |
| 8,339,883 B2 ‡ | 12/2012 | Yu | G11C 7/12 | 365/19 |
| 8,347,154 B2 ‡ | 1/2013 | Bahali | G06F 11/008 | 365/20 |
| 8,351,292 B2 ‡ | 1/2013 | Matano | G11C 5/063 | 365/21 |
| 8,356,144 B2 ‡ | 1/2013 | Hessel | G06F 9/30036 | 711/15 |
| 8,417,921 B2 ‡ | 4/2013 | Gonion | G06F 8/4441 | 712/22 |
| 8,462,532 B1 ‡ | 6/2013 | Argyres | G11C 15/04 | 365/15 |
| 8,484,276 B2 ‡ | 7/2013 | Carlson | G06F 17/142 | 708/40 |
| 8,495,438 B2 ‡ | 7/2013 | Roine | G06F 11/1008 | 714/71 |
| 8,503,250 B2 ‡ | 8/2013 | Demone | G11C 7/1039 | 365/14 |
| 8,526,239 B2 ‡ | 9/2013 | Kim | G11C 16/344 | 365/18 |
| 8,533,245 B1 ‡ | 9/2013 | Cheung | G06F 1/03 | 708/20 |
| 8,555,037 B2 ‡ | 10/2013 | Gonion | G06F 8/4441 | 712/22 |
| 8,599,613 B2 ‡ | 12/2013 | Abiko | G11C 16/26 | 365/18 |
| 8,605,015 B2 ‡ | 12/2013 | Guttag | G09G 3/3685 | 345/84 |
| 8,625,376 B2 ‡ | 1/2014 | Jung | G11C 7/1006 | 365/18 |
| 8,644,101 B2 ‡ | 2/2014 | Jun | G11C 7/062 | 365/20 |

(56) References Cited

U.S. PATENT DOCUMENTS

| | | | |
|---|---|---|---|
| 8,650,232 B2 ‡ | 2/2014 | Stortz | G06F 7/02 708/20 |
| 8,873,272 B2 ‡ | 10/2014 | Lee | G11C 29/48 365/14 |
| 8,964,496 B2 ‡ | 2/2015 | Manning | G11C 7/1006 365/20 |
| 8,971,124 B1 ‡ | 3/2015 | Manning | G11C 7/06 365/18 |
| 9,015,390 B2 ‡ | 4/2015 | Klein | G06F 9/30036 710/5 |
| 9,047,193 B2 ‡ | 6/2015 | Lin | G06F 9/30043 |
| 9,165,023 B2 ‡ | 10/2015 | Moskovich | G06F 9/30021 |
| 2001/0007112 A1 ‡ | 7/2001 | Porterfield | |
| 2001/0008492 A1 ‡ | 7/2001 | Higashiho | G11C 7/06 365/19 |
| 2001/0010057 A1 ‡ | 7/2001 | Yamada | G06F 15/7821 709/20 |
| 2001/0028584 A1 ‡ | 10/2001 | Nakayama | G11C 29/24 365/20 |
| 2001/0043089 A1 ‡ | 11/2001 | Forbes | G11C 7/065 327/67 |
| 2002/0059355 A1 ‡ | 5/2002 | Peleg et al. | |
| 2002/0069339 A1 ‡ | 6/2002 | Lasserre | G06F 1/206 711/20 |
| 2003/0167426 A1 ‡ | 9/2003 | Slobodnik | G11C 29/16 714/71 |
| 2003/0222879 A1 ‡ | 12/2003 | Lin | G06F 7/57 345/53 |
| 2004/0073592 A1 ‡ | 4/2004 | Kim | G06F 7/508 708/71 |
| 2004/0073773 A1 ‡ | 4/2004 | Demjanenko | |
| 2004/0085840 A1 ‡ | 5/2004 | Vali | G11C 7/062 365/20 |
| 2004/0095826 A1 ‡ | 5/2004 | Perner | G11C 7/06 365/20 |
| 2004/0154002 A1 ‡ | 8/2004 | Ball | G06F 17/5022 717/13 |
| 2004/0205289 A1 ‡ | 10/2004 | Srinivasan | G06F 12/0246 711/10 |
| 2004/0240251 A1 ‡ | 12/2004 | Nozawa | G11C 11/22 365/14 |
| 2005/0015557 A1 ‡ | 1/2005 | Wang | G06F 3/0613 711/15 |
| 2005/0078514 A1 ‡ | 4/2005 | Scheuerlein | G11C 8/10 365/18 |
| 2005/0097417 A1 ‡ | 5/2005 | Agrawal | G11C 29/24 714/73 |
| 2006/0047937 A1 ‡ | 3/2006 | Selvaggi et al. | |
| 2006/0069849 A1 ‡ | 3/2006 | Rudelic | G06F 12/0246 711/10 |
| 2006/0146623 A1 ‡ | 7/2006 | Mizuno et al. | |
| 2006/0149804 A1 ‡ | 7/2006 | Luick et al. | |
| 2006/0181917 A1 ‡ | 8/2006 | Kang | G11C 7/065 365/14 |
| 2006/0215432 A1 ‡ | 9/2006 | Wickeraad et al. | |
| 2006/0225072 A1 ‡ | 10/2006 | Lari | G06F 8/61 717/17 |
| 2006/0291282 A1 ‡ | 12/2006 | Liu | G11C 16/0466 365/18 |
| 2007/0103986 A1 ‡ | 5/2007 | Chen | G11C 11/5642 365/18 |
| 2007/0171747 A1 ‡ | 7/2007 | Hunter et al. | |
| 2007/0180006 A1 ‡ | 8/2007 | Gyoten | G06F 13/1652 708/20 |
| 2007/0180184 A1 ‡ | 8/2007 | Sakashita et al. | |
| 2007/0195602 A1 ‡ | 8/2007 | Fong | G11C 16/10 365/18 |
| 2007/0285131 A1 ‡ | 12/2007 | Sohn | G11C 7/02 326/95 |
| 2007/0285979 A1 ‡ | 12/2007 | Turner | G11C 5/005 365/17 |
| 2007/0291532 A1 ‡ | 12/2007 | Tsuji | G11C 11/16 365/15 |
| 2008/0025073 A1 ‡ | 1/2008 | Arsovski | G11C 7/067 365/14 |
| 2008/0037333 A1 ‡ | 2/2008 | Kim | G11C 7/1051 365/18 |
| 2008/0052711 A1 ‡ | 2/2008 | Forin | G06F 9/4411 718/10 |
| 2008/0137388 A1 ‡ | 6/2008 | Krishnan | G11C 15/04 365/49 |
| 2008/0165601 A1 ‡ | 7/2008 | Matick et al. | |
| 2008/0178053 A1 ‡ | 7/2008 | Gorman | G01R 31/31724 714/71 |
| 2008/0215937 A1 ‡ | 9/2008 | Dreibelbis | G01R 31/31724 714/71 |
| 2009/0067218 A1 ‡ | 3/2009 | Graber | G11C 7/067 365/14 |
| 2009/0154238 A1 ‡ | 6/2009 | Lee | G11C 11/5628 365/18 |
| 2009/0154273 A1 ‡ | 6/2009 | Borot | G11C 29/24 365/20 |
| 2009/0254697 A1 ‡ | 10/2009 | Akerib | G11C 7/1006 711/10 |
| 2010/0067296 A1 ‡ | 3/2010 | Li | G11C 8/10 365/18 |
| 2010/0091582 A1 ‡ | 4/2010 | Vali | G11C 11/5628 365/18 |
| 2010/0172190 A1 ‡ | 7/2010 | Lavi | G11C 7/02 365/18 |
| 2010/0210076 A1 ‡ | 8/2010 | Gruber | G11C 5/025 438/12 |
| 2010/0226183 A1 ‡ | 9/2010 | Kim | G11C 16/0483 365/18 |
| 2010/0308858 A1 ‡ | 12/2010 | Noda | G11C 7/1006 326/10 |
| 2010/0313104 A1 ‡ | 12/2010 | Bommena | H03M 13/09 714/80 |
| 2010/0332895 A1 ‡ | 12/2010 | Billing et al. | |
| 2011/0051523 A1 ‡ | 3/2011 | Manabe | G11C 16/349 365/18 |
| 2011/0063919 A1 ‡ | 3/2011 | Chandrasekhar | G11C 16/10 365/18 |
| 2011/0093662 A1 ‡ | 4/2011 | Walker | G06F 15/7821 711/14 |
| 2011/0103151 A1 ‡ | 5/2011 | Kim | G11C 11/5628 365/18 |
| 2011/0119467 A1 ‡ | 5/2011 | Cadambi | G06F 1/7821 712/27 |
| 2011/0122695 A1 ‡ | 5/2011 | Li | G11C 11/5628 365/18 |
| 2011/0140741 A1 ‡ | 6/2011 | Zerbe | H04L 25/03006 327/57 |
| 2011/0219260 A1 ‡ | 9/2011 | Nobunaga | G11C 29/76 714/6 |
| 2011/0267883 A1 ‡ | 11/2011 | Lee | G11C 16/0441 365/18 |
| 2011/0317496 A1 ‡ | 12/2011 | Bunce | G11C 7/1051 365/18 |
| 2012/0005397 A1 ‡ | 1/2012 | Lim | G11C 7/062 710/31 |
| 2012/0017039 A1 ‡ | 1/2012 | Margetts | |
| 2012/0023281 A1 ‡ | 1/2012 | Kawasaki | G06F 9/3001 710/31 |
| 2012/0120705 A1 ‡ | 5/2012 | Mitsubori | G11C 29/025 365/72 |
| 2012/0134216 A1 ‡ | 5/2012 | Singh | G01J 3/02 365/18 |
| 2012/0134225 A1 | 5/2012 | Chow | |
| 2012/0134226 A1 ‡ | 5/2012 | Chow | G11C 7/08 365/20 |
| 2012/0135225 A1 ‡ | 5/2012 | Colas | A61K 9/7084 428/33 |
| 2012/0140540 A1 ‡ | 6/2012 | Agam | G11C 8/08 365/49 |
| 2012/0182798 A1 ‡ | 7/2012 | Hosono | G11C 11/5621 365/18 |

(56) References Cited

U.S. PATENT DOCUMENTS

| | | | | |
|---|---|---|---|---|
| 2012/0195146 A1‡ | 8/2012 | Jun | ............... | G11C 7/062 365/20 |
| 2012/0198310 A1‡ | 8/2012 | Tran et al. | | |
| 2012/0246380 A1‡ | 9/2012 | Akerib | ............... | G11C 7/1006 711/5 |
| 2012/0265964 A1‡ | 10/2012 | Murata et al. | | |
| 2012/0281486 A1‡ | 11/2012 | Rao | ............... | G11C 7/1048 365/18 |
| 2012/0303627 A1‡ | 11/2012 | Keeton et al. | | |
| 2013/0003467 A1‡ | 1/2013 | Klein | ............... | G11C 7/1006 365/18 |
| 2013/0061006 A1‡ | 3/2013 | Hein | | |
| 2013/0107623 A1‡ | 5/2013 | Kavalipurapu | .... | G11C 16/0483 365/18 |
| 2013/0117541 A1‡ | 5/2013 | Choquette | ............... | G06F 9/3842 712/21 |
| 2013/0124783 A1‡ | 5/2013 | Yoon | ............... | G06F 12/0246 711/10 |
| 2013/0132702 A1‡ | 5/2013 | Patel et al. | | |
| 2013/0138646 A1‡ | 5/2013 | Sirer et al. | | |
| 2013/0163362 A1‡ | 6/2013 | Kim | ............... | G11C 7/00 365/20 |
| 2013/0173888 A1‡ | 7/2013 | Hansen | ............... | G06F 9/4484 712/22 |
| 2013/0205114 A1‡ | 8/2013 | Badam | ............... | G06F 3/0613 711/20 |
| 2013/0219112 A1‡ | 8/2013 | Okin et al. | | |
| 2013/0227361 A1‡ | 8/2013 | Bowers | ............... | G06F 11/1666 714/71 |
| 2013/0283122 A1‡ | 10/2013 | Anholt et al. | | |
| 2013/0286705 A1‡ | 10/2013 | Grover | ............... | G11C 7/12 365/49 |
| 2013/0326154 A1‡ | 12/2013 | Haswell | | |
| 2013/0332707 A1‡ | 12/2013 | Gueron et al. | | |
| 2014/0185395 A1‡ | 7/2014 | Seo | ............... | G11C 7/22 365/18 |
| 2014/0215185 A1‡ | 7/2014 | Danielsen | ............... | G06F 9/381 712/20 |
| 2014/0250279 A1‡ | 9/2014 | Manning | ............... | G06F 12/00 711/15 |
| 2014/0344934 A1‡ | 11/2014 | Jorgensen | | |
| 2015/0134713 A1‡ | 5/2015 | Wheeler | | |
| 2015/0324290 A1‡ | 11/2015 | Leidel | ............... | G06F 12/0817 711/14 |
| 2015/0325272 A1‡ | 11/2015 | Murphy | ............... | G06F 12/0284 711/14 |

FOREIGN PATENT DOCUMENTS

| | | | | |
|---|---|---|---|---|
| EP | 2026209 | ‡ | 2/2009 | |
| JP | H0831168 | ‡ | 2/1996 | |
| JP | 2009259193 | ‡ | 3/2015 | |
| KR | 10-0211482 | ‡ | 8/1998 | |
| KR | 10-2010-0134235 | ‡ | 12/2010 | |
| KR | 10-2013-0049421 | ‡ | 5/2013 | |
| WO | 2001065359 | | 9/2001 | |
| WO | WO-2001065359 | ‡ | 9/2001 | |
| WO | 2010079451 | | 7/2010 | |
| WO | WO-2010079451 | ‡ | 7/2010 | |
| WO | 2013062596 | | 5/2013 | |
| WO | WO-2013062596 A1 ‡ | | 5/2013 | ........... G11C 19/188 |
| WO | 2013081588 | | 6/2013 | |
| WO | 2013095592 | | 6/2013 | |
| WO | WO-2013081588 | ‡ | 6/2013 | |
| WO | WO-2013095592 | ‡ | 6/2013 | |

OTHER PUBLICATIONS

Stojmenovic, "Multiplicative Circulant Networks Topological Properties and Communication Algorithms", (25 pgs.), Discrete Applied Mathematics 77 (1997) 281-305.‡

"4.9.3 MinLoc and MaxLoc", Jun. 12, 1995, (5pgs.), Message Passing Interface Forum 1.1, retrieved from http://www.mpi-forum.org/docs/mpi-1.1/mpi-11-html/node79.html.‡

Derby, et al., "A High-Performance Embedded DSP Core with Novel SIMD Features", Apr. 6-10, 2003, (4 pgs), vol. 2, pp. 301-304, 2003 IEEE International Conference on Acoustics, Speech, and Signal Processing.‡

Debnath, BIPLOB, Bloomflash: Bloom Filter on Flash-Based Storage, 2011 31st Annual Conference on Distributed Computing Systems, Jun. 20-24, 2011, 10 pgs.‡

Pagiamtzis, Kostas, "Content-Addressable Memory Introduction", Jun. 25, 2007, (6 pgs.), retrieved from: http://www.pagiamtzis.com/cam/camintro.‡

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.‡

International Search Report and Written Opinion for PCT Application No. PCT/US2013/043702, dated Sep. 26, 2013, (11 pgs.).‡

Elliot, et al., "Computational RAM: Implementing Processors in Memory", Jan.-Mar. 1999, (10 pgs.), vol. 16, Issue 1, IEEE Design and Test of Computers Magazine.‡

Dybdahl, et al., "Destructive-Read in Embedded DRAM, Impact on Power Consumption," Apr. 2006, (10 pgs.), vol. 2, Issue 2, Journal of Embedded Computing—Issues in embedded single-chip multicore architectures.‡

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.‡

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.‡

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.‡

U.S. Appl. No. 13/449,082, entitled, "Methods and Apparatus for Pattern Matching," filed Apr. 17, 2012, (37 pgs.).‡

U.S. Appl. No. 13/743,686, entitled, "Weighted Search and Compare in a Memory Device," filed Jan. 17, 2013, (25 pgs.).‡

U.S. Appl. No. 13/774,636, entitled, "Memory as a Programmable Logic Device," filed Feb. 22, 2013, (30 pgs.).‡

U.S. Appl. No. 13/774,553, entitled, "Neural Network in a Memory Device," filed Feb. 22, 2013, (63 pgs.).‡

U.S. Appl. No. 13/796,189, entitled, "Performing Complex Arithmetic Functions in a Memory Device," filed Mar. 12, 2013, (23 pgs.).‡

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

* cited by examiner
‡ imported from a related application

|     |     | 444 | 445 | 456 | 470 | 471 |
|-----|-----|-----|-----|-----|-----|-----|
|     |     | A   | B   | NOT OPEN | OPEN TRUE | OPEN INVERT |
|     |     | 0   | 0   | 0   | 0   | 1   |
|     |     | 0   | 1   | 0   | 1   | 0   |
|     |     | 1   | 0   | 1   | 0   | 1   |
|     |     | 1   | 1   | 1   | 1   | 0   |

475 → (crossover)

413-1

| | FF | 0 | 0 | 0 | 0 | 0 | 0 | 1 | 1 | 1 | ← 476 |
| | FT | 0 | 0 | 0 | 1 | 1 | 1 | 0 | 0 | 0 | ← 477 |
| | TF | 0 | 0 | 1 | 0 | 0 | 1 | 0 | 0 | 1 | ← 478 |
| | TT | 0 | 1 | 0 | 0 | 1 | 0 | 0 | 1 | 0 | ← 479 |
| A | B | A | A*B | A*B̄ | A+B | B | AXB | A+B̄ | ĀXB̄ | B̄ | ← 447 |
| 0 | 0 | 0 | 0 | 0 | 0 | 0 | 0 | 1 | 1 | 1 | |
| 0 | 1 | 0 | 0 | 0 | 1 | 1 | 1 | 0 | 0 | 0 | |
| 1 | 0 | 1 | 0 | 1 | 1 | 0 | 1 | 1 | 0 | 1 | |
| 1 | 1 | 1 | 1 | 0 | 1 | 1 | 0 | 1 | 1 | 0 | |

MULTIPLE ENDIANNESS COMPATIBILITY

PRIORITY INFORMATION

This application is a Continuation of U.S. application Ser. No. 14/885,546, filed Oct. 16, 2015, which issues as U.S. Pat. No. 10,163,467 on Dec. 25, 2018, which claims the benefit of U.S. Provisional Application No. 62/064,561, filed Oct. 16, 2014, the contents of which are incorporated herein by reference.

TECHNICAL FIELD

The present disclosure relates generally to semiconductor memory apparatuses and methods, and more particularly, to apparatuses and methods related to supporting multiple endianness compatibility.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units (e.g., herein referred to as functional unit circuitry such as arithmetic logic unit (ALU) circuitry, floating point unit (FPU) circuitry, and/or a combinatorial logic block, for example, which can execute instructions to perform logical operations such as AND, OR, NOT, NAND, NOR, and XOR logical operations on data (e.g., one or more operands).

A number of components in an electronic system may be involved in providing instructions to the functional unit circuitry for execution. The instructions may be generated, for instance, by a processing resource such as a controller and/or host processor. Data (e.g., the operands on which the instructions will be executed to perform the logical operations) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the operations and/or data may also be sequenced and/or buffered.

In many instances, the processing resources (e.g., processor and/or associated functional unit circuitry) may be external to the memory array, and data can be accessed (e.g., via a bus between the processing resources and the memory array to execute instructions). Data can be moved from the memory array to registers external to the memory array via a bus or to a host or processor. Data (e.g., bits) can be ordered based on bit significance in a bytewise big endian or bytewise little endian format. A bytewise big endian format orders bytes from most to least significant while a little endian format orders bytes from least to most significant. Bits can be ordered within each byte in bitwise big endian or bitwise little endian, among other orders.

BRIEF DESCRIPTION OF THE DRAWINGS

FIG. 4B is a logic table illustrating selectable logic operation results implemented by sensing circuitry in accordance with a number of embodiments of the present disclosure.

DETAILED DESCRIPTION

Figure 1:
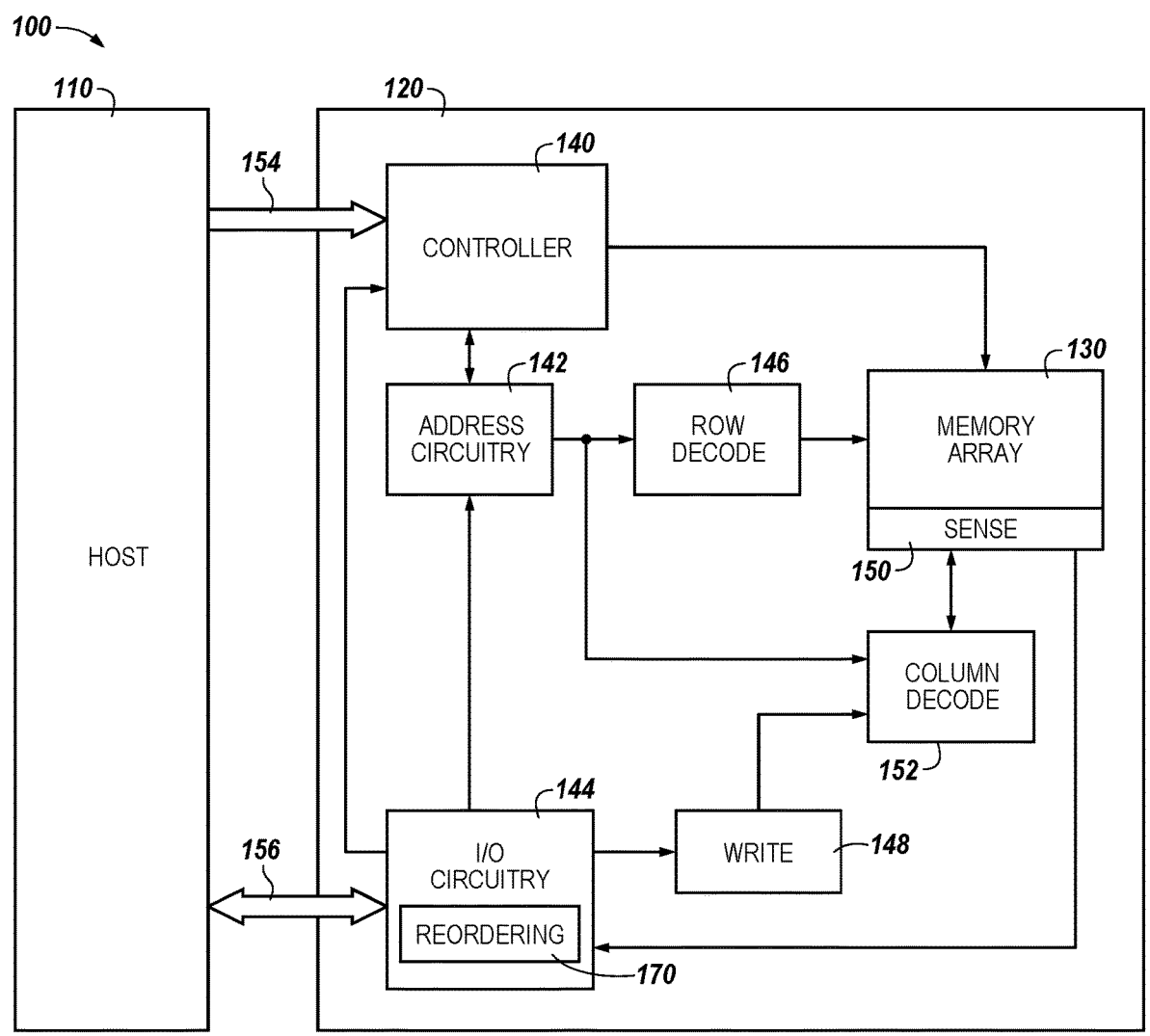
FIG. 1 is a block diagram of an apparatus in the form of a computing system including a memory device in accordance with a number of embodiments of the present disclosure.

The present disclosure includes apparatuses and methods related to multiple endianness compatibility. To ensure compatibility for multiple endiannesses, an order of a plurality of bytes received in a bytewise little endian format can be reordered (e.g., by reversing an ordering of the bits in each byte of the plurality of bytes such that the plurality of bytes are arranged in a bit-sequential little endian format) to be in a bit-sequential format. The plurality of bytes arranged in a bit-sequential little endian format or big endian format can be stored in an array of memory cells. The bit-sequential little endian format is an arrangement of the bits from a least significant bit of each byte of the plurality of bytes being stored in a most significant bit position and a most significant bit of each byte of the plurality of bytes being stored in a least significant bit position. The bit-sequential big endian format is an arrangement of bits from a most significant bit of each byte of a plurality of bytes being stored in a most significant bit position and a least significant bit of each byte of the plurality of bytes being stored in a least significant bit position.

Reordering the bits of a byte to be bit-sequential (with respect to a bit's significance in the byte) can provide transparent support from a host's perspective of little endian compatibility or big endian compatibility for performing operations (e.g., shift operations in memory). For example, bits of an element in a bytewise little endian format (but still big endian bitwise) can be sent from a host to be processed. The bits of the element can be reordered to be bit-sequential and a number of operations can be performed on the bit-sequential bits. The bit-sequential bits can be reordered back to the bytewise little endian (bitwise big endian) format and returned to the host transparently, independent of additional shifting calculations (e.g., shifting in memory) to account for non-sequential bits. In addition, bits that are non-sequential in big endian format can be reordered to be bit-sequential. The reordering of the bits can be performed independent of knowledge of how many bytes the element contains. In previous approaches, knowledge of how many bytes comprise an element was used to determine how to switch bytes from little endian format to big endian format and vice versa. For example, to switch a byte from a least significant byte position to a most significant byte position, how many total bytes for an element was known in order to know the distance to move the bytes. However, the reordering can be performed on a bytewise basis as each byte is received so that a determination of the total bytes is irrelevant to the reordering. In this way, both bytewise big endian and bytewise little endian formats can be processed independent of additional operation calculations (as bytewise big endian is already bit-sequential and the reordering of the bytewise little endian bits sequentially orders the bits).

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "S," "T," "U," "V," "W," etc., particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 231 may reference element "31" in FIG. 2, and a similar element may be referenced as 331 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, a memory array 130, and/or sensing circuitry 150 might also be separately considered an "apparatus."

System 100 includes a host 110 coupled to memory device 120, which includes a memory array 130. Host 110 can be a host system such as a personal laptop computer, a desktop computer, a digital camera, a mobile telephone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines (which may be referred to herein as digit lines or data lines). Although a single array 130 is shown in FIG. 1, embodiments are not so limited. For instance, memory device 160 may include a number of arrays 130 (e.g., a number of banks of DRAM cells). An example DRAM array is described in association with FIGS. 2A and 4A.

The memory device 120 includes address circuitry 142 to latch address signals provided over an I/O bus 156 (e.g., a data bus and/or an address bus) through I/O circuitry 144. In this example, the bus 156 is illustrated as single I/O bus 156; however, the system 100 can include separate data and address busses. Address signals are received and decoded by a row decoder 146 and a column decoder 152 to access the memory array 130. Data can be read from memory array 130 by sensing voltage and/or current changes on the sense lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

The I/O circuitry 144 can include reordering circuitry 170 that performs a number of operations to reorder data (e.g., bits and/or bytes) received thereto. The reordering circuitry 170 can reorder data received thereto (e.g., from host 110 and/or array 130) and send (e.g., transmit) the reordered data to a desired location (e.g., host 110, array 130, and/or elsewhere). The reordering circuitry 170 can be a number of multiplexers that reorder bits of a byte. In a number of embodiments, whether reordering of the data occurs can be determined based on the status of an indicator (e.g., a flag). The reordering circuitry 170 can be an engine including software, hardware, and/or firmware. While the reordering circuitry 170 is illustrated as within the I/O circuitry 144 (e.g., within the I/O data path), examples are not so limited. For example, the reordering circuitry 170 can be located on controller 140, on a channel controller (not shown and which may be located on device 120 or host 110, for instance), on address circuitry 142, and/or in additional locations. In a number of embodiments, reordering of the data can include modifying addresses associated with the data.

Controller 140 decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110. The controller 140 can comprise hardware, software, and/or firmware, and can be, for example, a state machine, a sequencer, or some other type of controller. The controller 140 can perform a number of shift operations (e.g., via shifting circuitry 223 in memory array 230 in FIG. 2A). The controller 140 can be coupled to a host 110 in a similar manner (e.g., in relation to its wiring) for a number of endiannesses (e.g., little endianness and big endianness) such that the host 110 does not have an endianness fixed in hardware. Reordering of bits can be performed based on an indication (e.g., a flag register) whose value is not fixed in the hardware.

Reordering the bits and bytes can be performed on an element including a number of 8-bit bytes. The bits can be ordered based on a significance of each bit within a byte. The bytes can be ordered based on a significance of the byte within an element. A number of operations can be performed on the bits that include shifting a bit from one location to another in order to perform the operations. The direction of the shift can be determined based on the format that the bits are ordered in. For example, a bit can be shifted toward a more significant bit or a less significant bit based on what operation is being performed. If the bits are ordered from most significant to least significant and a shift is in the direction of toward more significant bits, the bits would shift towards the left. If the bits are ordered from least significant to most significant and a shift is in the direction of toward more significant bits, the bits would shift towards the right, and so forth.

Sequential bits can be shifted based on the number of shifts corresponding to a particular operation. Non-sequential bits can be shifted based on the distance to the next sequential bit. For example, if a first and second bit in sequence is next to one another and the operation is to perform one shift, the bit can move one position. However, if the first and second bit are out of sequence by eight positions (e.g., the size of a byte if they are sequentially off by a byte), one shift to be performed by the operation would turn into eight shifts since they are eight positions out of sequence. Ordering the bits sequentially can improve efficiency of shifting and decrease the number of calculations performed when performing an operation.

An example of the sensing circuitry 150 is described further below in association with FIGS. 2A and 4A. For instance, in a number of embodiments, the sensing circuitry 150 can comprise a number of sense amplifiers and a number of compute components, which may comprise a latch serving as an accumulator and can be used to perform logical operations (e.g., on data associated with complementary sense lines). In a number of embodiments, the sensing circuitry (e.g., 150) can be used to perform a number of operations (e.g., shift operations) using data stored in array 130 as inputs and store the results of the operations back to the array 130 without transferring via a sense line address access (e.g., without firing a column decode signal). As such, a mathematical function can be performed using sensing circuitry 150 rather than and/or in addition to being performed by processing resources external to the sensing circuitry 150 (e.g., by a processor associated with host 110 and/or other processing circuitry, such as ALU circuitry, located on device 160 (e.g., on controller 140 or elsewhere)).

In various previous approaches, data associated with an operation, for instance, would be read from memory via sensing circuitry and provided to an external ALU. The external ALU circuitry would perform the functions using the elements (which may be referred to as operands or inputs) and the result could be transferred back to the array via the local I/O lines. In contrast, in a number of embodiments of the present disclosure, sensing circuitry (e.g., 150) is configured to perform an operation on data stored in memory cells in memory array 130 and store the result back to the array 130 without enabling a local I/O line coupled to the sensing circuitry. The operations performed in memory array 130 includes a number of shift operations that are affected by the format of the data (e.g., whether in big endian or little endian formats). Data in big endian format may include shifting in a first direction while data in little endian format may include shifting a different direction. However, by reordering the data to be bit-sequential in both big endian and little endian formats, the shifting operations can be simplified and replicated by simply reversing the directions of the shift.

Figure 2A:
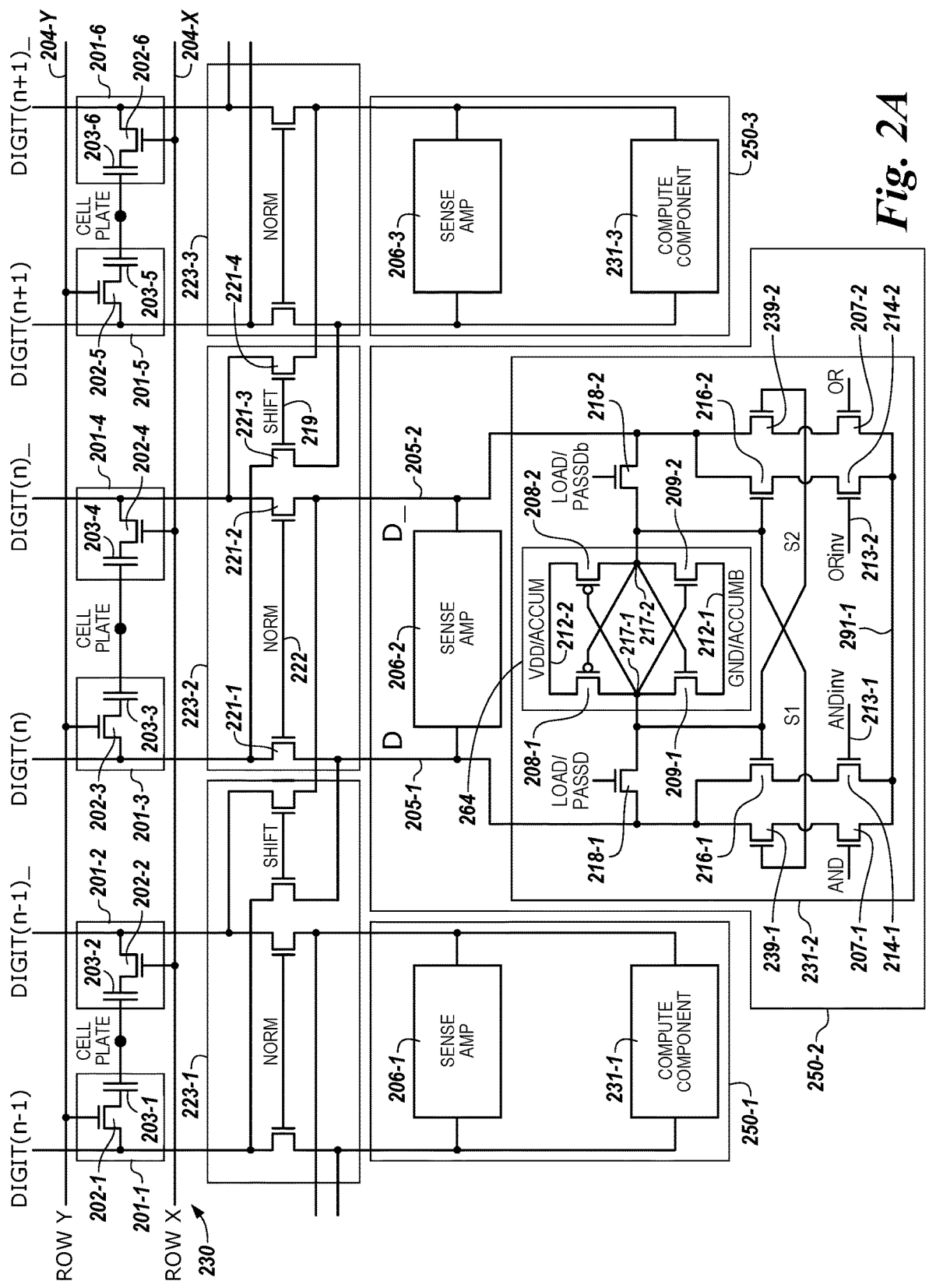
FIG. 2A illustrates a schematic diagram of a portion of a memory array in accordance with a number of embodiments of the present disclosure.

FIG. 2A illustrates a schematic diagram of a portion of a memory array 230 in accordance with a number of embodiments of the present disclosure. A memory cell comprises a storage element (e.g., capacitor) and an access device (e.g., transistor). For instance, transistor 202-1 and capacitor 203-1 comprises memory cell 201-1, transistor 202-2 and capacitor 203-2 comprises memory cell 201-2, transistor 202-3 and capacitor 203-3 comprises memory cell 201-3, and transistor 202-4 and capacitor 203-4 comprises memory cell 201-4, etc. In this example, the memory array 230 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read). The cells of the memory array 230 are arranged in rows coupled by word lines 204-X (Row X), 204-Y (Row Y), etc., and columns coupled by pairs of complementary data lines DIGIT(n−1)/DIGIT(n−1)_, DIGIT(n)/DIGIT(n)_, DIGIT(n+1)/DIGIT(n+1)_. The individual data lines corresponding to each pair of complementary data lines can also be referred to as data lines 205-1 (D) and 205-2 (D_) respectively. Although only three pair of complementary data lines are shown in FIG. 2A, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 202-3 can be coupled to data line 205-1 (D), a second source/drain region of transistor 202-3 can be coupled to capacitor 203-3, and a gate of a transistor 202-3 can be coupled to word line 204-X. A first source/drain region of a transistor 202-4 can be coupled to data line 205-2 (D_), a second source/drain region of transistor 202-4 can be coupled to capacitor 203-4, and a gate of a transistor 202-4 can be coupled to word line 204-Y. The cell plate, as shown in FIG. 2A, can be coupled to each of capacitors 203-3 and 203-4. The cell plate can be a common node to which a reference voltage (e.g., ground) can be applied in various memory array configurations.

The memory array 230 is coupled to sensing circuitry 250-1, 250-2, 250-3, etc., in accordance with a number of embodiments of the present disclosure. Sensing circuitry comprises a sense amplifier and a compute component corresponding to respective columns of memory cells (e.g., coupled to respective pairs of complementary data lines). In this example, the sensing circuitry 250-1 comprises a sense amplifier 206-1 and a compute component 231-1 corresponding to respective columns of memory cells (e.g., memory cells 201-1 and 201-2 coupled to respective pairs of complementary data lines). Sensing circuitry 250-2 comprises a sense amplifier 206-2 and a compute component 231-2 corresponding to respective columns of memory cells (e.g., memory cells 201-3 and 201-4 coupled to respective pairs of complementary data lines). Sensing circuitry 250-3 comprises a sense amplifier 206-3 and a compute component 231-3 corresponding to respective columns of memory cells (e.g., memory cells 201-5 and 201-6 coupled to respective pairs of complementary data lines). A sense amplifier (e.g., sense amplifier 206-1) can comprise a cross coupled latch, which can be referred to herein as a primary latch. The sense amplifier (e.g., sense amplifier 206-1) can be configured, for example, as described with respect to FIG. 2B.

In the example illustrated in FIG. 2A, the circuitry corresponding to compute component 231-2 comprises a static latch 264 and an additional ten transistors that implement, among other things, a dynamic latch. For ease of reference, compute component 231-2 has been illustrated in an expanded format to describe the functioning of the compute component. Additional compute components (e.g., compute components 231-1 and 231-3) include elements of the expanded format of compute component 231-2 but are not illustrated in FIG. 2A. The dynamic latch and/or static latch of the compute component 231-2 can be collectively referred to herein as a secondary latch, which can serve as an accumulator. As such, the compute component 231-2 can operate as and/or be referred to herein as an accumulator. The compute component 231-2 can be coupled to each of the data lines D 205-1 and D_ 205-2 as shown in FIG. 2A. However, embodiments are not limited to this example. The transistors of compute component 231-2 can all be n-channel transistors (e.g., NMOS transistors), for example.

In this example, data line D 205-1 can be coupled to a first source/drain region of transistors 216-1 and 239-1, as well as to a first source/drain region of load/pass transistor 218-1. Data line D_ 205-2 can be coupled to a first source/drain region of transistors 216-2 and 239-2, as well as to a first source/drain region of load/pass transistor 218-2.

The gates of load/pass transistor 218-1 and 218-2 can be commonly coupled to a LOAD control signal, or respectively coupled to a PASSD/PASSDB control signal, as discussed further below. A second source/drain region of load/pass transistor 218-1 can be directly coupled to the gates of transistors 216-1 and 239-2. A second source/drain region of load/pass transistor 218-2 can be directly coupled to the gates of transistors 216-2 and 239-1.

A second source/drain region of transistor 216-1 can be directly coupled to a first source/drain region of pull-down transistor 214-1. A second source/drain region of transistor 239-1 can be directly coupled to a first source/drain region of pull-down transistor 207-1. A second source/drain region of transistor 216-2 can be directly coupled to a first source/drain region of pull-down transistor 214-2. A second source/drain region of transistor 239-2 can be directly coupled to a first source/drain region of pull-down transistor 207-2. A second source/drain region of each of pull-down transistors 207-1, 207-2, 214-1, and 214-2 can be commonly coupled together to a reference voltage (e.g., ground (GND)). A gate of pull-down transistor 207-1 can be coupled to an AND control signal line, a gate of pull-down transistor 214-1 can be coupled to an ANDinv control signal line 213-1, a gate of pull-down transistor 214-2 can be coupled to an ORinv control signal line 213-2, and a gate of pull-down transistor 207-2 can be coupled to an OR control signal line.

The gate of transistor 239-1 can be referred to as node S1, and the gate of transistor 239-2 can be referred to as node S2. The circuit shown in FIG. 2A stores accumulator data dynamically on nodes S1 and S2. Activating the LOAD control signal causes load/pass transistors 218-1 and 218-2 to conduct, and thereby load complementary data onto nodes S1 and S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 2A is not contingent on the LOAD control signal being elevated to a voltage greater than $V_{DD}$.

The configuration of compute component 231-2 shown in FIG. 2A has the benefit of balancing the sense amplifier for functionality when the pull-down transistors 207-1, 207-2, 214-1, and 214-2 are conducting before the sense amplifier 206-2 is fired (e.g., during pre-seeding of the sense amplifier 206-2). As used herein, firing the sense amplifier 206-2 refers to enabling the sense amplifier 206-2 to set the primary latch and subsequently disabling the sense amplifier 206-2 to retain the set primary latch. Performing logical operations after equilibration is disabled (in the sense amp), but before the sense amplifier fires, can save power usage because the latch of the sense amplifier does not have to be "flipped" using full rail voltages (e.g., $V_{DD}$, GND).

Inverting transistors can pull-down a respective data line in performing certain logical operations. For example, transistor 216-1 (having a gate coupled to S2 of the dynamic latch) in series with transistor 214-1 (having a gate coupled to an ANDinv control signal line 213-1) can be operated to pull-down data line 205-1 (D), and transistor 216-2 (having a gate coupled to S1 of the dynamic latch) in series with transistor 214-2 (having a gate coupled to an ANDinv control signal line 213-2) can be operated to pull-down data line 205-2 (D_).

The latch 264 can be controllably enabled by coupling to an active negative control signal line 212-1 (ACCUMB) and an active positive control signal line 212-2 (ACCUM) rather than be configured to be continuously enabled by coupling to ground and $V_{DD}$. In various embodiments, load/pass transistors 208-1 and 208-2 can each having a gate coupled to one of a LOAD control signal or a PASSD/PASSDB control signal.

According to some embodiments, the gates of load/pass transistors 218-1 and 218-2 can be commonly coupled to a LOAD control signal. In the configuration where the gates of load/pass transistors 218-1 and 218-2 are commonly coupled to the LOAD control signal, transistors 218-1 and 218-2 can be load transistors. Activating the LOAD control signal causes the load transistors to conduct, and thereby load complementary data onto nodes S1 and S2. The LOAD control signal can be elevated to a voltage greater than $V_{DD}$ to pass a full $V_{DD}$ level to S1/S2. However, the LOAD control signal need not be elevated to a voltage greater than $V_{DD}$ is optional, and functionality of the circuit shown in FIG. 2A is not contingent on the LOAD control signal being elevated to a voltage greater than $V_{DD}$.

According to some embodiments, the gate of load/pass transistor 218-1 can be coupled to a PASSD control signal, and the gate of load/pass transistor 218-2 can be coupled to a PASSDB control signal. In the configuration where the gates of transistors 218-1 and 218-2 are respectively coupled to one of the PASSD and PASSDB control signals, transistors 218-1 and 218-2 can be pass transistors. Pass transistors can be operated differently (e.g., at different times and/or under different voltage/current conditions) than load transistors. As such, the configuration of pass transistors can be different than the configuration of load transistors.

Load transistors are constructed to handle loading associated with coupling data lines to the local dynamic nodes S1 and S2, for example. Pass transistors are constructed to handle heavier loading associated with coupling data lines to an adjacent accumulator (e.g., through the shift circuitry 223-2 in memory array 230, as shown in FIG. 2A). According to some embodiments, load/pass transistors 218-1 and 218-2 can be configured to accommodate the heavier loading corresponding to a pass transistor but be coupled and operated as a load transistor. Load/pass transistors 218-1 and 218-2 configured as pass transistors can also be utilized as load transistors. However, load/pass transistors 218-1 and 218-2 configured as load transistors may not be capable of being utilized as pass transistors.

In a number of embodiments, the compute component 231-2, including the latch 264, can comprise a number of transistors formed on pitch with the transistors of the corresponding memory cells of an array (e.g., array 230 shown in FIG. 2A) to which they are coupled, which may conform to a particular feature size (e.g., $4F^2$, $6F^2$, etc.). According to various embodiments, latch 1364 includes four transistors 208-1, 208-2, 1309-1, and 209-2 coupled to a pair of complementary data lines D 205-1 and D_ 205-2 through load/pass transistors 218-1 and 218-2. However, embodiments are not limited to this configuration. The latch 264 can be a cross coupled latch (e.g., gates of a pair of transistors, such as n-channel transistors (e.g., NMOS transistors) 209-1 and 209-2 are cross coupled with the gates of another pair of transistors, such as p-channel transistors (e.g., PMOS transistors) 208-1 and 208-2). As described further herein, the cross coupled latch 264 can be referred to as a static latch.

The voltages or currents on the respective data lines D and D_ can be provided to the respective latch inputs 217-1 and 217-2 of the cross coupled latch 264 (e.g., the input of the secondary latch). In this example, the latch input 217-1 is coupled to a first source/drain region of transistors 208-1 and 209-1 as well as to the gates of transistors 208-2 and 209-2. Similarly, the latch input 217-2 can be coupled to a first source/drain region of transistors 208-2 and 209-2 as well as to the gates of transistors 208-1 and 209-1.

Figure 2B:
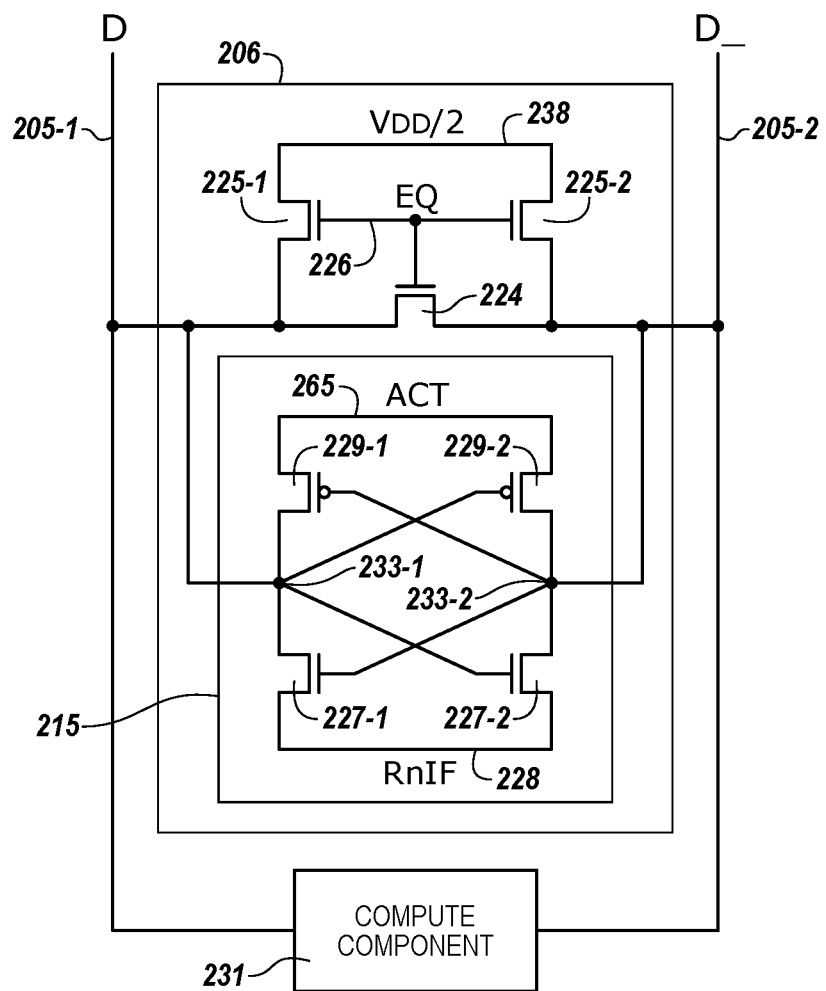
FIG. 2B illustrates a schematic diagram of a portion of sensing circuitry in accordance with a number of embodiments of the present disclosure.

In this example, a second source/drain region of transistor 209-1 and 209-2 is commonly coupled to a negative control signal line 1312-1 (e.g., ground (GND) or ACCUMB control signal similar to control signal RnIF shown in FIG. 2B with respect to the primary latch). A second source/drain region of transistors 208-1 and 208-2 is commonly coupled to a positive control signal line 212-2 (e.g., $V_{DD}$ or ACCUM control signal similar to control signal ACT shown in FIG. 2B with respect to the primary latch). The positive control signal 212-2 can provide a supply voltage (e.g., $V_{DD}$) and the negative control signal 212-1 can be a reference voltage (e.g., ground) to enable the cross coupled latch 264. According to some embodiments, the second source/drain region of transistors 208-1 and 208-2 are commonly coupled directly to the supply voltage (e.g., $V_{DD}$), and the second source/drain region of transistor 209-1 and 209-2 are commonly coupled directly to the reference voltage (e.g., ground) so as to continuously enable latch 264.

The enabled cross coupled latch 264 operates to amplify a differential voltage between latch input 217-1 (e.g., first common node) and latch input 217-2 (e.g., second common node) such that latch input 217-1 is driven to either the activated positive control signal voltage (e.g., $V_{DD}$) or the activated negative control signal voltage (e.g., ground), and latch input 217-2 is driven to the other of the activated positive control signal voltage (e.g., $V_{DD}$) or the activated negative control signal voltage (e.g., ground).

As shown in FIG. 2A, the sense amplifier 206-2 and the compute component 231-2 can be coupled to the array 230 via shift circuitry 223-2. In this example, the shift circuitry 223-2 comprises a pair of isolation devices (e.g., isolation transistors 221-1 and 221-2) coupled to data lines 205-1 (D) and 205-2 (D_), respectively). The isolation transistors 221-1 and 221-2 are coupled to a control signal 222 (NORM) that, when activated, enables (e.g., turns on) the isolation transistors 221-1 and 221-2 to couple the corresponding sense amplifier 206-2 and compute component 231-2 to a corresponding column of memory cells (e.g., to a corresponding pair of complementary data lines 205-1 (D) and 205-2 (D_)). According to various embodiments, conduction of isolation transistors 221-1 and 221-2 can be referred to as a "normal" configuration of the shift circuitry 223-2.

In the example illustrated in FIG. 2A, the shift circuitry 223-2 includes another (e.g., a second) pair of isolation devices (e.g., isolation transistors 221-3 and 221-4) coupled to a complementary control signal 219 (SHIFT), which can be activated, for example, when NORM is deactivated. The isolation transistors 221-3 and 221-4 can be operated (e.g., via control signal 219) such that a particular sense amplifier 206-2 and compute component 231-2 are coupled to a different pair of complementary data lines (e.g., a pair of complementary data lines different than the pair of complementary data lines to which isolation transistors 221-1 and 221-2 couple the particular sense amplifier 206-2 and compute component 231-2), or can couple a particular sense amplifier 206-2 and compute component 231-2 to another memory array (and isolate the particular sense amplifier 206-2 and compute component 231-2 from a first memory array). According to various embodiments, the shift circuitry 223-2 can be arranged as a portion of (e.g., within) the sense amplifier 206-2, for instance.

Although the shift circuitry 223-2 shown in FIG. 2A includes isolation transistors 221-1 and 221-2 used to couple particular sensing circuitry 250-2 (e.g., a particular sense amplifier 206-2 and corresponding compute component 231-2) to a particular pair of complementary data lines 205-1 (D) and 205-2 (D_) (e.g., DIGIT(n) and DIGIT(n)_) and isolation transistors 221-3 and 221-4 are arranged to couple the particular sensing circuitry 250-2 to an adjacent pair of complementary data lines in one particular direction (e.g., adjacent data lines DIGIT(n+1) and DIGIT(n+1)_ shown to the right in FIG. 2A), embodiments of the present disclosure are not so limited. For instance, shift circuitry can include isolation transistors 221-1 and 221-2 used to couple particular sensing circuitry to a particular pair of complementary data lines (e.g., DIGIT(n) and DIGIT(n)_ and isolation transistors 221-3 and 221-4 arranged so as to be used to couple the particular sensing circuitry to an adjacent pair of complementary data lines in another particular direction (e.g., adjacent data lines DIGIT(n−1) and DIGIT(n−1)_ shown to the left in FIG. 2A). Shift circuitry 223-1 can include isolation transistors used to couple particular sensing circuitry 250-1 to a particular pair of complementary data lines (e.g., DIGIT(n−1) and DIGIT(n−1)_) and isolation transistors arranged to couple the particular sensing circuitry 250-1 to an adjacent pair of complementary data lines in one particular direction (e.g., adjacent data lines DIGIT(n) and DIGIT(n)_ shown in FIG. 2A). Shift circuitry 223-3 can include isolation transistors used to couple particular 250-3 to a particular pair of complementary data lines (e.g., DIGIT(n+1) and DIGIT(n+1)_) and isolation transistors arranged to couple the particular sensing circuitry 250-3 to an adjacent pair of complementary data lines in one particular direction (e.g., adjacent data lines DIGIT (n) and DIGIT(n)_ to the left and DIGIT(n+2) and DIGIT(n+2)_ to the right (not shown)).

Embodiments of the present disclosure are not limited to the configuration of shift circuitry 223-2 shown in FIG. 2A. In a number of embodiments, shift circuitry 223-2 such as that shown in FIG. 2A can be operated (e.g., in conjunction with sense amplifiers 206-2 and compute components 231-2) in association with performing compute functions such as adding and subtracting functions without transferring data out of the sensing circuitry 250 via an I/O line (e.g., local I/O line (IO/IO_)), for instance.

Although not shown in FIG. 2A, each column of memory cells can be coupled to a column decode line that can be activated to transfer, via local I/O line, a data value from a corresponding sense amplifier 206-2 and/or compute component 231-2 to a control component external to the array such as an external processing resource (e.g., host processor and/or other functional unit circuitry). The column decode line can be coupled to a column decoder (e.g., column decoder). However, as described herein, in a number of embodiments, data need not be transferred via such I/O lines to perform logical operations in accordance with embodiments of the present disclosure. In a number of embodiments, shift circuitry 223-2 can be operated in conjunction with sense amplifiers 206-2 and compute components 231-2 to perform reordering of the bits without transferring data to a control component external to the array, for instance.

FIG. 2B is a schematic diagram illustrating a portion of sensing circuitry in accordance with a number of embodiments of the present disclosure. According to various embodiments, sense amplifier 206-2 can comprise a cross coupled latch. However, embodiments of the sense amplifier 206-2 are not limited to a cross coupled latch. As an example, the sense amplifier 206-2 in FIG. 2B can be current-mode sense amplifier and/or single-ended sense amplifier (e.g., sense amplifier coupled to one data line). Also, embodiments of the present disclosure are not limited to a folded data line architecture.

In a number of embodiments, a sense amplifier (e.g., 206-2) can comprise a number of transistors formed on pitch with the transistors of the corresponding compute component 231-2 and/or the memory cells of an array (e.g., 230 shown in FIG. 2A) to which they are coupled, which may conform to a particular feature size (e.g., $4F^2$, $6F^2$, etc.). The sense amplifier 206-2 comprises a latch 215 including four transistors coupled to a pair of complementary data lines D 205-1 and D_ 205-2. The latch 215 can be a cross coupled latch (e.g., gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2). As described further herein, the latch 215 comprising transistors 227-1, 227-2, 229-1, and 229-2 can be referred to as a primary latch. However, embodiments are not limited to this example.

The voltages or currents on the respective data lines D and D_ can be provided to the respective latch inputs 233-1 and 233-2 of the cross coupled latch 215 (e.g., the input of the secondary latch). In this example, the latch input 233-1 is coupled to a first source/drain region of transistors 227-1 and 229-1 as well as to the gates of transistors 227-2 and 229-2. Similarly, the latch input 233-2 can be coupled to a first source/drain region of transistors 227-2 and 229-2 as well as to the gates of transistors 227-1 and 229-1. The compute component 231-2, which may be referred to herein as an accumulator, can be coupled to latch inputs 233-1 and 233-2 of the cross coupled latch 215 as shown; however, embodiments are not limited to the example shown in FIG. 2B.

In this example, a second source/drain region of transistor 227-1 and 227-2 is commonly coupled to an active negative control signal 228 (RnIF). A second source/drain region of transistors 229-1 and 229-2 is commonly coupled to an active positive control signal 290 (ACT). The ACT signal 290 can be a supply voltage (e.g., $V_{DD}$) and the RnIF signal can be a reference voltage (e.g., ground). Activating signals 228 and 290 enables the cross coupled latch 215.

The enabled cross coupled latch 215 operates to amplify a differential voltage between latch input 233-1 (e.g., first common node) and latch input 233-2 (e.g., second common node) such that latch input 233-1 is driven to one of the ACT signal voltage and the RnIF signal voltage (e.g., to one of $V_{DD}$ and ground), and latch input 233-2 is driven to the other of the ACT signal voltage and the RnIF signal voltage.

The sense amplifier 206-2 can also include circuitry configured to equilibrate the data lines D and D_ (e.g., in association with preparing the sense amplifier for a sensing operation). In this example, the equilibration circuitry comprises a transistor 224 having a first source/drain region coupled to a first source/drain region of transistor 225-1 and data line D 205-1. A second source/drain region of transistor 224 can be coupled to a first source/drain region of transistor 225-2 and data line D_ 205-2. A gate of transistor 224 can be coupled to gates of transistors 225-1 and 225-2.

The second source drain regions of transistors 225-1 and 225-2 are coupled to an equilibration voltage 238 (e.g., $V_{DD}/2$), which can be equal to $V_{DD}/2$, where $V_{DD}$ is a supply voltage associated with the array. The gates of transistors 224, 225-1, and 225-2 can be coupled to control signal 225 (EQ). As such, activating EQ enables the transistors 224, 225-1, and 225-2, which effectively shorts data line D to data line D_ such that the data lines D and D_ are equilibrated to equilibration voltage $V_{DD}/2$. According to a number of embodiments of the present disclosure, a number of logical operations can be performed using the sense amplifier 206-2 and compute component 231-2, and the result can be stored in the sense amplifier and/or compute component.

The sensing circuitry 250 can be operated in several modes to perform logical operations, including a first mode in which a result of the logical operation is initially stored in the sense amplifier 206-2, and a second mode in which a result of the logical operation is initially stored in the compute component 231-2. Additionally with respect to the first operating mode, sensing circuitry 250 can be operated in both pre-sensing (e.g., sense amps fired before logical operation control signal active) and post-sensing (e.g., sense amps fired after logical operation control signal active) modes with a result of a logical operation being initially stored in the sense amplifier 206-2.

As described further below, the sense amplifier 206-2 can, in conjunction with the compute component 231-2, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments eliminate the need to transfer data across I/O lines in order to perform compute functions (e.g., between memory and discrete processor), a number of embodiments can enable an increased parallel processing capability as compared to previous approaches.

Figure 3A:
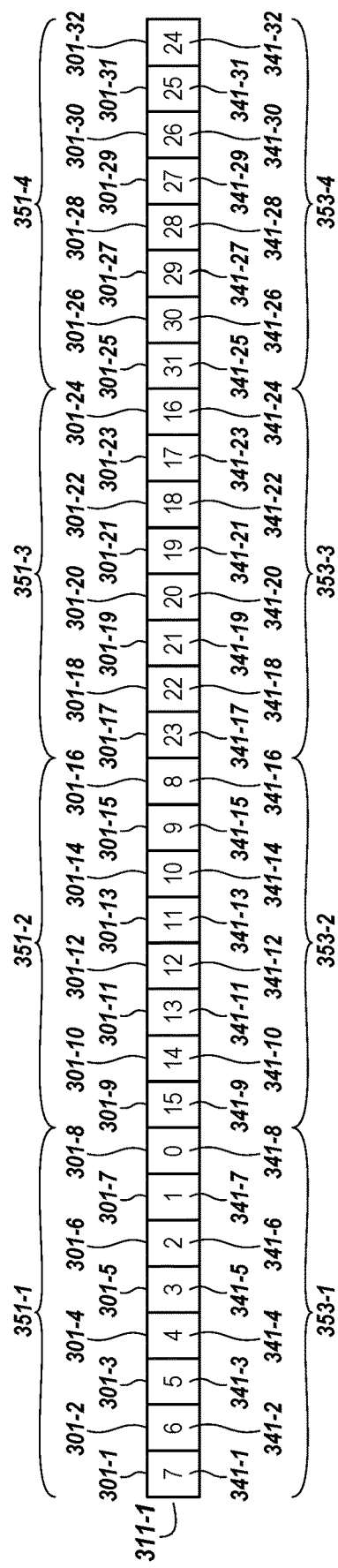
FIGS. 3A-3C illustrate a schematic diagram of a portion of a memory array in accordance with a number of embodiments of the present disclosure.
Figure 3B:
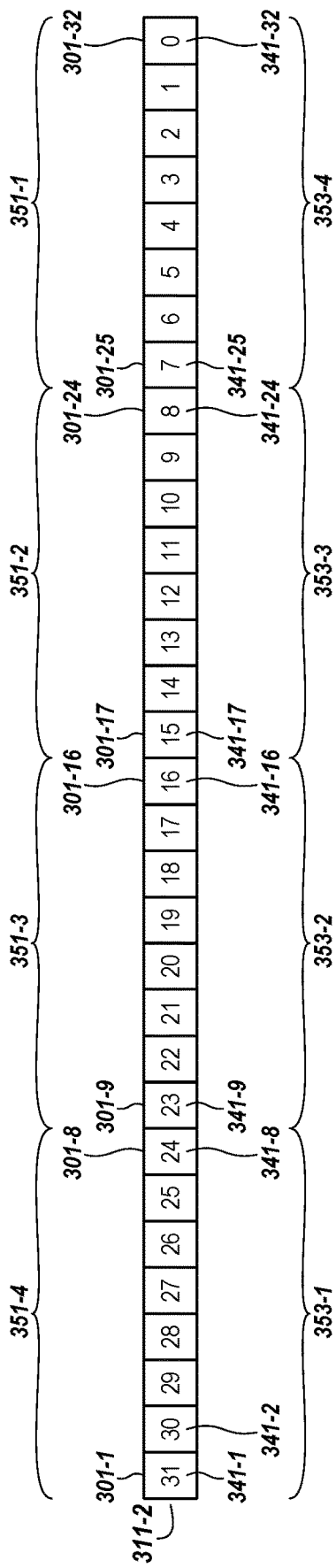
Figure 3C:
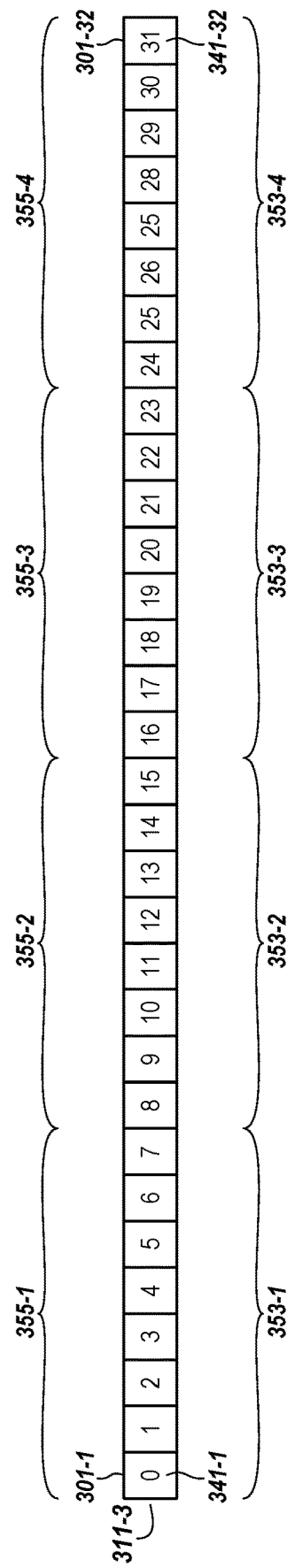

FIGS. 3A-3C illustrate schematic diagrams of a portion of a memory array storing data in accordance with a number of embodiments of the present disclosure. FIG. 3A illustrates a row 311-1 of a plurality of memory cells 301-1 to 301-32 storing an element (e.g., a plurality of data values, bits, etc.). Each of the plurality of memory cells 301-1 to 301-32 can be coupled to a corresponding sense line and a corresponding access line. Each of the corresponding sense lines can be coupled to sensing circuitry. For example, memory cell 301-1 (e.g., corresponding to memory cell 201-3 in FIG. 2A) is coupled to a sense line (e.g., sense line 205-1) and an access line (e.g., access line 204-Y). The sense line (e.g., 205-1) is coupled to sensing circuitry (e.g., sensing circuitry 250-2). Memory cell 301-1 can correspond to memory cell 201-1 in FIG. 2A, cell 301-2 can correspond to cell 201-2, cell 301-3 can correspond to cell 201-3, cell 301-4 can correspond to cell 201-4, cell 301-5 can correspond to cell 201-5, and cell 301-6 can correspond to cell 201-6. Cells 301-7 to 301-32 can correspond to cells 201-7 to 201-32 (not shown). While the example given describes a correspondence using both cells (e.g., cells 203-3 and 203-4) coupled to a pair of complementary sense lines (e.g., sense lines 205-1 and 205-2), embodiments are not so limited. For example, cell 301-1 can correspond to cell 201-1 and cell 301-2 can correspond to cell 201-3, thereby using a cell coupled to each of a first sense line of the pair of complementary sense lines.

In this example, a 32-bit element can be stored in a row 331-1 of the plurality of memory cells 301-1 to 301-32. The 32-bit element includes a number of bits and can represent a data value (e.g., a base ten (10) numerical value). The example 32-bit element includes four (4) bytes with eight bits per byte. Embodiments are not so limited as a byte with any number of bits may be used. The bits of the 32-bit element example each have a corresponding significance within the 32-bit element. For example, a first bit (e.g., the "0"$^{th}$ bit illustrated as stored in cell 301-8) can be a least significant bit, meaning the first bit has the least significance within the 32-bit element. A $32^{nd}$ bit (e.g., the "31"$^{st}$ bit illustrated as stored in cell 301-25 in FIG. 3A) can be a most significant bit, meaning the $32^{nd}$ bit has the most significance within the 32-bit element. A significance of a bit can also correspond to a significance within a byte. For example, a first byte 351-1 can have a least significant bit of the first byte 351-1 (e.g., an "0"$^{th}$ bit in cell 301-8 in FIG. 3A) and a most significant bit for the first byte 351-1 (e.g., a "7"$^{th}$ bit in cell 301-1 in FIG. 3A). A second byte 351-2 can have a least significant bit of the second byte 351-2 (e.g., an "8"$^{th}$ bit stored in cell 301-16 in FIG. 3A) and a most significant bit for the second byte 351-2 (e.g., a "15"$^{th}$ bit stored in cell 301-9 in FIG. 3A). A third byte 351-3 can have a least significant bit of the third byte 351-3 (e.g., a "16"$^{th}$ bit stored in cell 301-24 in FIG. 3A) and a most significant bit of the third byte 351-3 (e.g., a "23"$^{rd}$ bit stored in cell 301-17 in FIG. 3A). A fourth byte 351-4 can have a least significant bit of the fourth byte 351-4 (e.g., a "24"$^{th}$ bit stored in cell 301-32 in FIG. 3A) and a most significant bit of the fourth byte 351-4 (e.g., a "31"$^{st}$ bit stored in cell 301-25 in FIG. 3A).

A number of bytes within an element can also have a significance. For example, a 32-bit element, as illustrated in FIG. 3A, can include a first byte 351-1, a second byte 351-2, a third byte 351-3, and a fourth byte 351-4. A most significant byte of a 32-bit element includes the most significant bits (e.g., the "31"$^{st}$ through "24"$^{th}$ bits are the most significant for the 32-bit element example). For example, the fourth byte 351-4 would be the most significant byte as the fourth byte 351-4 includes the most significant bits of the 32-bit element in FIG. 3A.

Bits within a byte and bytes within an element can correspond to a particular significance position. Bits within a byte can have a most significant bit position (e.g., corresponding to a smallest address or left-most address) and a least significant bit position (e.g., corresponding to a largest address or right-most address). For example, a first byte 351-1 can have a most significant bit position 353-1 that corresponds to a bit stored in cell 301-1 (e.g., the left-most bit position for the first byte 351-1). For example, the most significant bit (e.g., "7"$^{th}$ bit) of the first byte 351-1 is stored in the most significant bit position flag of the first byte 351-1. The second most-significant bit (e.g., "6") of the first byte 351-1 is stored in the second most-significant bit position 341-2. Further, the most significant bit (e.g., "15"$^{th}$) of the second byte 351-2 is in the most significant bit position 341-9 of the second byte 351-2, the most significant bit (e.g., "23"$^{rd}$) of the third byte 351-3 is in the most significant bit position 341-17 of the third byte 351-3, and the most significant bit (e.g., "31"$^{st}$) of the fourth byte 351-4 is in the most significant bit position 341-25 of the fourth byte 351-4.

Bytes within an element can have a most significant byte position (e.g., corresponding to a smallest byte address or left-most byte address) and a least significant byte position (e.g., corresponding to a largest byte address or left-most byte address). For example, a least significant byte (e.g., byte 351-1 including least significant bits "0" through "7") is in a most significant byte position 353-1 in FIG. 3A. For example, the byte is located furthest to the left in the element sequence. The second byte 351-2 is in a second most significant byte position 353-2, the third byte 351-3 is in a third most significant byte position 353-3, and the fourth byte 351-4 is in a least significant byte position 353-4. However, the least significant byte position is not limited to a fourth byte position. For example, an element with 64 bits, including 8 bits per byte, would have an eighth byte in the least significant byte position. A number of bytes and byte positions can depend on the size of the element.

In the illustrated example, the plurality of bits (e.g., "0"$^{th}$ through "31"$^{st}$ bits of the 32-bit element 311-1) are stored in the plurality of corresponding memory cells 301-1 to 301-32 in a bytewise little endian format. Little endian can refer to an order of least significant to most significant (e.g., least significant byte stored in a smallest or left-most address and most significant byte stored in a largest or right-most address). Big endian can refer to an order of most significant to least significant (e.g., most significant byte stored in a smallest or left-most address and least significant byte stored in a largest or right-most address). Bitwise little endian refers to storing bits (e.g., "0" to "31") in memory cells (e.g., cells 301-1 to 301-32) from a least significant bit to a most significant bit (from left to right). Bytewise little endian refers to storing bytes (e.g., 351-1, 351-2, 351-3, and 351-4) in order from a least significant byte (e.g., 351-1) to a most significant byte (e.g., 351-4). The plurality of bits (e.g., bits "0" to "31" illustrated in FIG. 3A) are stored in a bytewise little endian format but are bit-wise big-endian. For example, the bits within a byte are stored from most significant bit to least significant bit (e.g., first byte 351-1 is ordered from "7"$^{th}$ bit to "0"$^{th}$ bit) while the bytes are stored from least significant byte (e.g., byte 351-1 in most significant byte position 353-1) to most significant byte (e.g., byte 351-4 in least significant byte position 353-4). Hosts (e.g., processors) can often send and receive information in a bytewise little endian format or a bytewise big endian format, both ordered bitwise as big endian due to data being read byte by byte.

While the example provided shows the bits ordered from least significant to most significant or most significant to least significant (as in little endian or big endian format), bits may be ordered in a number of different ways depending on how the host (e.g., a processor) and/or a number of devices may have altered the order to perform a number of functions (e.g., perform a mathematical calculation with the bits, etc.). The ordering of the bits (e.g., as stored in the memory) can be used for performing a number of operations (e.g., shift operations) so that bits can be shifted based on significance by using the contiguousness of the bits to perform the shifts.

When performing a number of operations, such as shift operations and/or mathematical calculations using the architecture of the memory array, the order of the bits can become important. For example, a bytewise big endian format is bit-sequential while a bytewise little endian (when still bitwise big endian) is non-sequential. Shifting becomes more problematic when bits are not sequential because a determination of the next contiguous bit (in terms of significance) would be determined before performing a shift and the shift would include additional movement based on the location of the next contiguous bit. For example, if a first 32-bit element representing a first numerical value (e.g., a base ten (10) numerical value) is to be multiplied by a second 32-bit element representing a second numerical value, each 8-bit byte of each of the elements represent a portion of the numerical values and calculations including shifting across the whole element may be performed for the calculation. For a bytewise big endian format (as illustrated in row 311-2 in FIG. 3B), the bits are sequential (in relation to significance) and therefore the shifts can be performed without further calculation. If the elements are ordered in a bytewise little endian format (and bitwise big endian, such as in row 311-1), the bits are non-sequential and determinations of contiguous bits and how many spaces each contiguous bit is from the current bit being calculated would need to be determined.

FIG. 3B illustrates a schematic diagram of a portion of a memory array in accordance with a number of embodiments of the present disclosure. FIG. 3B illustrates an element 311-2 stored in memory in a big endian format both bytewise and bitwise. For example, the most significant byte (e.g., byte 351-4 including most significant bites "31" through "24") is stored in memory cells 301-1 to 301-8 corresponding to a most significant byte position 353-1. The second (or next) most significant byte (e.g., byte 351-3) is stored in memory cells 301-9 to 301-16 corresponding to a second most significant byte position 353-2, the third most significant byte (e.g., byte 351-2) is stored in memory cells 301-17 to 301-24 corresponding to a third most significant byte position 353-3, and the least (or fourth most) significant byte (e.g., byte 351-1) is stored in memory cells 301-25 to 301-32 corresponding to a least (or fourth most) significant byte position 353-4.

The bits (e.g., bits "0" through "31") of element 311-2 are stored in a bit-sequential little endian format. For example, the bits are ordered from bit "31" to bit "0" in sequential order. Further, bit "24" of byte 351-4 stored in memory cell 301-8 corresponding to the least significant bit position 341-8 of byte 351-4 is ordered right before bit "23" of byte 351-3 stored in memory cell 301-9 corresponding to the most significant bit position 341-9 of byte 351-3. Bit "16" is stored in memory cell 301-16 and ordered right before bit "15" (stored in memory cell 301-17) and bit "8" is stored in memory cell 301-24, right before bit "8" stored in memory cell 301-25. In this way, each bit in the least significant bit position of a byte is sequential with the following bit in the next most significant byte's most significant bit position. As mentioned above, since hosts (e.g., processors) process on a bytewise basis and bytes are read from most significant bit to least significant bit, a processor can read in either bytewise little endian format or bytewise big endian format (with the ordered bits being ordered in a bitwise big endian format).

FIG. 3C illustrates a schematic diagram of a portion of a memory array in accordance with a number of embodiments of the present disclosure. The row 311-3 of a 32-bit element is ordered in a bytewise little endian format and a bitwise little endian format. For example, the bits are ordered such that a least significant bit (e.g., bit "0") of the 32-bit element is in a most significant bit position (e.g., bit position 341-1) of a least significant byte (e.g., byte 355-1 including bits "0" through "7") in a most significant byte position (e.g., byte position 353-1). Further, a most significant bit (e.g., bit "31") of element 311-3 is in a least significant bit position (e.g., bit position 341-32) of a most significant byte (e.g., byte 355-4 including bits "24" through "31") in a least significant byte position (e.g., byte position 353-4).

An element can be reordered from a bytewise little endian, bitwise big endian format (e.g., 32-bit element stored in row 311-1) to a bytewise little endian, bitwise little endian format (e.g., 32-bit element stored in row 311-3). The bytewise little endian, bitwise little endian format is also referred to as bit-sequential little endian as the bits of the 32-bit element stored in row 311-3 have bits ordered sequentially (e.g., ordered from bit "0" to "31" in sequential order). The 32-bit element can be arranged in a bit-sequential little endian format from a bytewise little endian, bitwise big endian format by reordering the bits of a byte on a bytewise basis. For example, byte 351-1 in row 311-1 of FIG. 3A includes bits "7," "6," "5," "4," "3," "2," "1," and "0," in that order (from most significant bit to least significant bit of byte 351-1). The bits of byte 351-1 in row 311-1 can be reversed by reordering circuitry (e.g., reordering circuitry 170 in FIG. 1) to be ordered in a bitwise little endian format, resulting in bits "0," "1," "2," "3," "4," "5," "6," and "7" being stored in cells 301-1, 301-2, 301-3, 301-4, 301-5, 301-6, 301-7 and 301-8, respectively (e.g., as shown in cells 301-1 to 301-8 of byte 355-1 in FIG. 3C).

The reordering circuitry (e.g., reordering circuitry 170 in FIG. 1) can reorder the bits on a bytewise basis such that the total number of bytes in an element does not need to be determined before reordering the bits of the element. For example, when receiving bits of the 32-bit element of row 311-1, the reordering circuitry may not know there are four (4) bytes in the element and can process the bits to a bit-sequential little endian format without knowing the number of bytes of the element. As the reordering circuitry receives the first eight (8) bits (e.g., bits "7" through "0"), the reordering circuitry reorders the bits to be in a reversed order (e.g., to bits "0" through "7", as illustrated by byte 355-1 in FIG. 3C). As the reordering circuitry receives the second byte (e.g., byte 351-2 including bits "15" through "8"), the reordering circuitry reverses the bits to by "8" through "15" (as illustrated by byte 355-2 in FIG. 3C). Since the reordering circuitry can reorder on a bytewise basis, the reordering will continue until the element has been received (without knowing how many total bytes when it starts reordering). However, embodiments are not so limited. A number of elements can be received (beyond the 32-bit element example) and the reordering circuitry can continue to reorder bits for a number of elements as the number of elements are received.

When performing a number of mathematical calculations using the bits, the direction of shifting from one compute component to another can be important. Performing a number of shift operations can include shifting bits stored in a big endian format both bitwise and bytewise (e.g., illustrated in row 311-2). When shifting bits stored in a bitwise and bytewise big endian format, bits can be shifted from a less significant bit towards a more significant bit. Further, the bits can be shifted from being stored in a first location (e.g., compute component 231-2) corresponding to a lesser significant bit position to a second location (e.g., compute component 231-1) corresponding to a more significant bit position. For example, a bit can be shifted from a compute component (e.g., compute component 231-2) corresponding to bit position 341-2 to a compute component (e.g., compute component 231-1) corresponding to bit position 341-1 of row 311-2. When shifting bits in a bit-sequential little endian format, the direction of shifting is reversed. For example, a less significant bit is still shifted toward a more significant bit but a bit in a more significant bit position is shifted toward a less significant bit position (e.g., to the right in the illustrated example of FIG. 3C). To summarize, for bits in a big endian format both bitwise and bytewise, the bits that are shifted left are shifted right when reordered in a bit-sequential little endian format. Similarly, bits shifted right in big endian format (both bitwise and bytewise) are shifted left when in a bit-sequential little endian format when performing the same shifting operations. As such, the shifting operation direction can be adjusted depending on the data format.

When an element is received by the reordering circuitry, the element can be reordered from a bytewise little endian, bitwise big endian format to a bit-sequential little endian format and stored in a number of memory cells (e.g., cells 301-1 to 301-32 in FIGS. 3A-3C). A number of shift operations can be performed on the bits stored in a bit-sequential little endian format in the memory cells using sensing circuitry, for example. The bits stored in the memory cells can be sent to the reordering circuitry and can be reordered from the bit-sequential little endian format to a bytewise little endian, bitwise big endian format. The reordering circuitry can reorder the bits in bit-sequential little endian format by reversing the bits on a bytewise basis. For example, the reordering circuitry can receive byte 355-1 in the order of bits "0," "1," "2," "3," "4," "5," "6," and "7" (as illustrated in cells 301-1 to 301-8 in FIG. 3C). The reordering circuitry can reverse the bits to "7," "6," "5," "4," "3," "2," "1," and "0." The reordering circuitry can receive a second byte 355-2 and reorder the bits from bits "8" to "15" to bits "15" to "8," and so on with bytes 355-3, and 355-4 to output a 32-bit element in bytewise little endian, bitwise big endian format (e.g., illustrated in row 311-1 of FIG. 3A). The bits in the bytewise little endian, bitwise big endian format can be sent to a host and/or a processor.

While the examples given include reordering bits from a non-bit-sequential little endian format to a bit-sequential little endian format, embodiments are not so limited. As bits may not be ordered sequentially even in bitwise big-endian formats, bits in a non-bit-sequential big endian format can be reordered to be bit-sequential (e.g., contiguous) in order to perform a number of operations (e.g., shift operations) on the bits. While a host's native endianness can be little endian or big endian, either format (little endian or big endian) can be used by the host after reordering. For example, a host can have little endian as the host's native endianness and use reordering of the bits to support big endian operation.

Figure 4A:
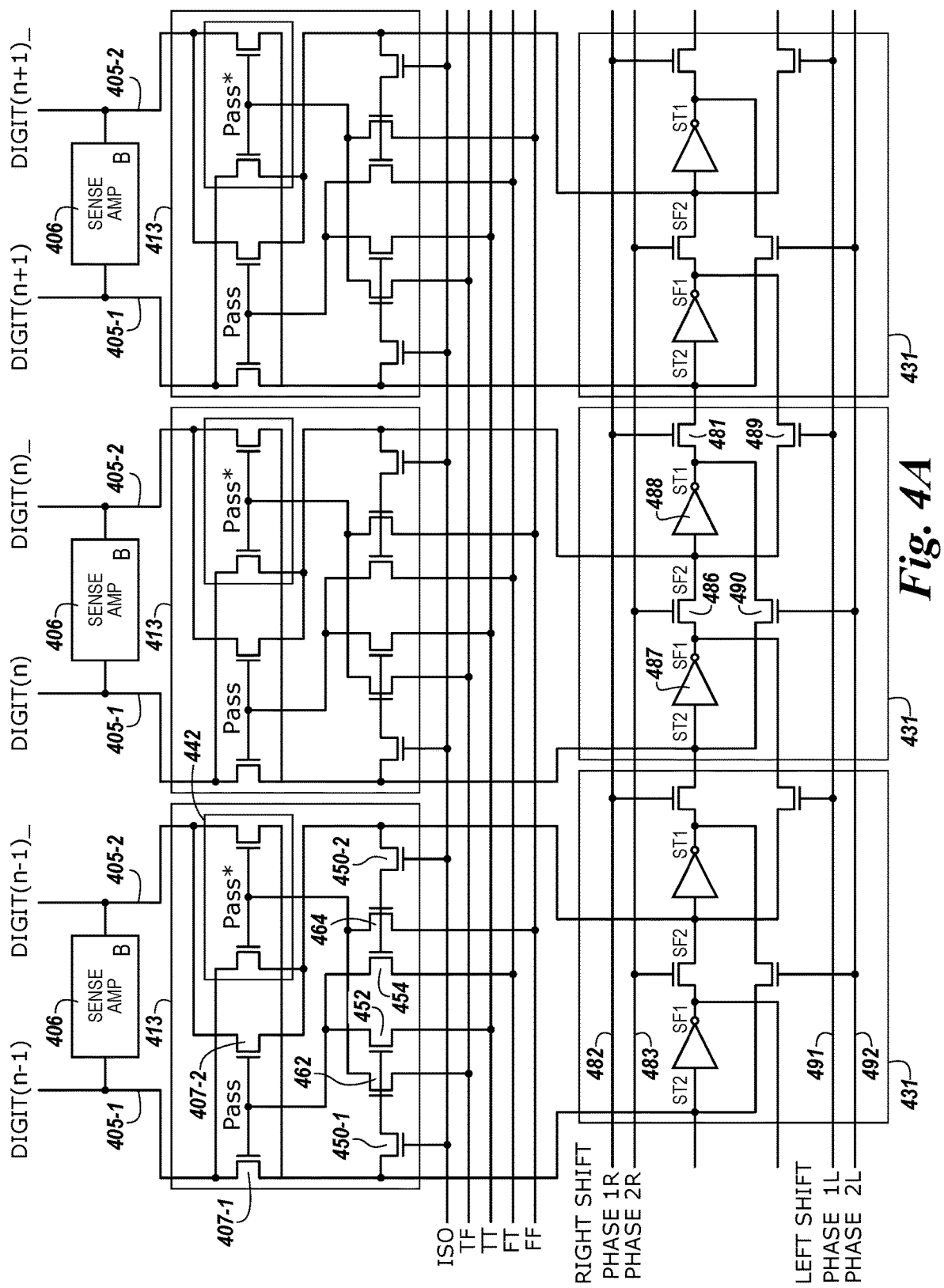
FIG. 4A is a schematic diagram illustrating sensing circuitry in accordance with a number of embodiments of the present disclosure.

FIG. 4A is a schematic diagram illustrating sensing circuitry capable of implementing a number of logical operations in accordance with a number of embodiments of the present disclosure. FIG. 4A shows a number of sense amplifiers 406 coupled to respective pairs of complementary sense lines 405-1 and 405-2, and a corresponding number of compute components 431 coupled to the sense amplifiers 406 via pass gates 407-1 and 407-2. The sense amplifiers 406 and compute components 431 shown in FIG. 4A can correspond to sensing circuitry 150 shown in FIG. 1, for example. The sensing circuitry shown in FIG. 4A includes logical operation selection logic 413, which can be operated as described further below.

Although not shown, memory cells (e.g., 201-3 and 201-4 in FIG. 2A) are coupled to the pairs of complementary sense lines 405-1 and 405-2 (e.g., columns). The memory cells can be, for example, 1T1C DRAM cells each comprising a storage element (e.g., capacitor) and an access device (e.g., transistor). For example, a memory cell can comprise a transistor and a capacitor. In a number of embodiments, the memory cells may be destructive read memory cells (e.g., reading the data stored in the cell destroys the data such that the data originally stored in the cell is refreshed after being read). The cells of the memory array can be arranged in rows coupled by word lines and columns coupled by pairs of complementary data lines DIGIT(n−1)/DIGIT(n−1)_, DIGIT(n)/DIGIT(n)_, DIGIT(n+1)/DIGIT(n+1)_. The individual data lines corresponding to each pair of complementary data lines can also be referred to as data lines 405-1 (D) and 405-2 (D_) respectively. Although only three pairs of complementary data lines (e.g., three columns) are shown in FIG. 4A, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of an access transistor of a memory cell can be coupled to a data line 405-1 (D), a second source/drain region of the access transistor of the memory cell can be coupled to a capacitor of the memory cell, and a gate of the access transistor of the memory cell can be coupled to a word line of the memory array.

As shown in FIG. 4A, the sensing circuitry can comprise a sense amplifier 406, a compute component 431, and logical operation selection logic 413 corresponding to respective columns of memory cells (e.g., coupled to respective pairs of complementary data lines). The sense amplifier 406 can comprise, for example, a cross coupled latch, which can be referred to herein as a primary latch. The sense amplifiers 406 can be configured, for example, as described with respect to FIG. 4B.

In the example illustrated in FIG. 4A, the circuitry corresponding to compute components 431 is configured as a loadable shift register. For instance, each compute component 431 comprises a latch, which may be referred to herein as a secondary latch, and an additional number of transistors operable to transfer (e.g., shift) data values right and/or left (e.g., to a latch of an adjacent compute component 431). As described further herein, in a number of embodiments, the latch of the compute component 431 can serve as an accumulator. As such, the compute component 431 can operate as and/or may be referred to herein as an accumulator.

The gates of the pass gates 407-1 and 407-2 can be controlled by a logical operation selection logic signal, Pass. For example, an output of the logical operation selection logic 413 can be coupled to the gates of the pass gates 407-1 and 407-2, as shown in FIG. 4A.

The sensing circuitry shown in FIG. 4A also shows logical operation selection logic 413 coupled to a number of logic selection control input control lines, including ISO, TF, TT, FT, and FF. Selection of a logical operation from a plurality of logical operations is determined from the condition of logic selection control signals on the logic selection control input control lines, as well as the data values present on the pairs of complementary sense lines 405-1 and 405-2 when the isolation transistors (e.g., 450-1 and 450-2) are enabled via the ISO control signal being asserted.

According to various embodiments, the logical operation selection logic 413 can include four logic selection transistors: logic selection transistor 462 coupled between the gates of the swap transistors 442 and a TF signal control line, logic selection transistor 452 coupled between the gates of the pass gates 407-1 and 407-2 and a TT signal control line, logic selection transistor 454 coupled between the gates of the pass gates 407-1 and 407-2 and a FT signal control line, and logic selection transistor 464 coupled between the gates of the swap transistors 442 and a FF signal control line. Gates of logic selection transistors 462 and 452 are coupled to the true sense line through isolation transistor 450-1 (having a gate coupled to an ISO signal control line). Gates of logic selection transistors 464 and 454 are coupled to the complementary sense line through isolation transistor 450-2 (also having a gate coupled to an ISO signal control line).

Data values present on the pair of complementary sense lines 405-1 and 405-2 can be loaded into the compute component 431 via the pass gates 407-1 and 407-2. When the pass gates 407-1 and 407-2 are OPEN, data values on the pair of complementary sense lines 405-1 and 405-2 are passed to the compute component 431 and thereby loaded into the loadable shift register. The data values on the pair of complementary sense lines 405-1 and 405-2 can be the data value stored in the sense amplifier 406 when the sense amplifier is enabled (e.g., fired). The logical operation selection logic signal, Pass, is activated to OPEN (e.g., turn on) the pass gates 407-1 and 407-2.

The ISO, TF, TT, FT, and FF control signals can operate to select a logical operation to implement based on the data value ("B") in the sense amplifier 406 and the data value ("A") in the compute component 431 (e.g., as used herein, the data value stored in a latch of a sense amplifier is referred to as a "B" data value, and the data value stored in a latch of a compute component is referred to as an "A" data value). In particular, the ISO, TF, TT, FT, and FF control signals are configured to select the logical operation (e.g., function) to implement independent from the data value present on the pair of complementary sense lines 405-1 and 405-2 (although the result of the implemented logical operation can be dependent on the data value present on the pair of complementary sense lines 405-1 and 405-2). For example, the ISO, TF, TT, FT, and FF control signals select the logical operation to implement directly since the data value present on the pair of complementary sense lines 405-1 and 405-2 is not passed through logic to operate the gates of the pass gates 407-1 and 407-2.

Additionally, FIG. 4A shows swap transistors 442 configured to swap the orientation of the pair of complementary sense lines 405-1 and 405-2 between the sense amplifier 406 and the compute component 431. For instance, when the swap transistors 442 are OPEN (e.g., turned on), data values on the pair of complementary sense lines 405-1 and 405-2 on the sense amplifier 406 side of the swap transistors 442 are oppositely-coupled to the pair of complementary sense lines 405-1 and 405-2 on the compute component 431 side of the swap transistors 442, and thereby loaded into the loadable shift register of the compute component 431 in a complementary manner.

As an example, the logical operation selection logic signal Pass can be activated (e.g., high) to OPEN (e.g., turn on) the pass gates 407-1 and 407-2 when the ISO control signal line is activated and either the TT control signal is activated (e.g., high) with the data value on the true sense line being "1" or the FT control signal is activated (e.g., high) with the data value on the complement sense line being "1."

The data value on the true sense line being a "1" OPENs logic selection transistors 452 and 462. The data value on the complementary sense line being a "1" OPENs logic selection transistors 454 and 464. If the ISO control signal or either the respective TT/FT control signal or the data value on the corresponding sense line (e.g., sense line to which the gate of the particular logic selection transistor is coupled) is not high, then the pass gates 407-1 and 407-2 will not be OPENed by a particular logic selection transistor.

The logical operation selection logic signal Pass* can be activated (e.g., high) to OPEN (e.g., turn on) the swap transistors 442 when the ISO control signal line is activated and either the TF control signal is activated (e.g., high) with data value on the true sense line being "1," or the FF control signal is activated (e.g., high) with the data value on the complement sense line being "1." If either the respective control signal or the data value on the corresponding sense line (e.g., sense line to which the gate of the particular logic selection transistor is coupled) is not high, then the swap transistors 442 will not be OPENed by a particular logic selection transistor.

The sensing circuitry illustrated in FIG. 4A is configured to select one of a plurality of logical operations to implement directly from the four logic selection control signals (e.g., logical operation selection is not dependent on the data value present on the pair of complementary sense lines). Some combinations of the logic selection control signals can cause both the pass gates 407-1 and 407-2 and swap transistors 442 to be OPEN (e.g., conducting) at the same time, which shorts the pair of complementary sense lines 405-1 and 405-2 together. According to a number of embodiments of the present disclosure, the logical operations which can be implemented by the sensing circuitry illustrated in FIG. 4A can be the logical operations summarized in the logic tables shown in FIG. 4B.

Although not shown in FIG. 4A, each column of memory cells can be coupled to a column decode line that can be activated to transfer, via a local I/O line, a data value from a corresponding sense amplifier 406 and/or compute component 431 to a control component external to the array such as an external processing resource (e.g., host processor and/or other functional unit circuitry). The column decode line can be coupled to a column decoder. However, as described herein, in a number of embodiments, data need not be transferred via such I/O lines to perform logical operations in accordance with embodiments of the present disclosure. In a number of embodiments, shift circuitry can be operated in conjunction with sense amplifiers 406 and compute components 431 to perform logical operations without transferring data to a control component external to the array, for instance. As used herein, transferring data, which may also be referred to as moving data is an inclusive term that can include, for example, copying data from a source location to a destination location and/or moving data from a source location to a destination location without necessarily maintaining a copy of the data at the source location.

As noted above, the compute components 431 can comprise a loadable shift register. In this example, each compute component 231 is coupled to a corresponding pair of complementary data lines 405-1/405-2, with a node ST2 being coupled to the particular data line (e.g., DIGIT(n)) communicating a "true" data value and with node SF2 being coupled to the corresponding complementary data line (e.g., DIGIT(n)_) communicating the complementary data value (e.g., "false" data value).

In this example, the loadable shift register comprises a first right-shift transistor 481 of a particular compute component 431 having a gate coupled to a first right-shift control line 482 (e.g., PHASE 1R), and a second right-shift transistor 486 of the particular compute component 231 having a gate coupled to a second right-shift control line 483 (e.g., PHASE 2R). Node ST2 of the particular control component is coupled to an input of a first inverter 487, whose output (e.g., node SF1) is coupled to a first source/drain region of transistor 286. The second source/drain region of transistor 486 is coupled to the input (e.g., node SF2) of a second inverter 488. The output (e.g., node ST1) of inverter 488 is coupled to a first source/drain region of transistor 481, and a second source/drain region of transistor 481 the particular compute component 431 is coupled to an input (e.g., node ST2) of a first inverter 487 of an adjacent compute component 431. The loadable shift register shown in FIG. 4A includes a first left-shift transistor 489 coupled between node SF2 of a particular compute component and node SF1 of an adjacent compute component 431. The loadable shift register shown in FIG. 4A also includes a second left-shift transistor 490 of a particular compute component 431 having a first source/drain region coupled to node ST2 and a second source/drain region coupled to node ST1. The gate of the first left-shift transistor 489 is coupled to a first left-shift control line 491 (e.g., PHASE 1L), and the gate of the second left-shift transistor 490 is coupled to a second left-shift control line 492 (e.g., PHASE 2L).

In operation, a data value on a pair of complementary data lines (e.g., 405-1/405-2) can be loaded into a corresponding compute component 431 (e.g., by operating logical operation selection logic as described above). As an example, a data value can be loaded into a compute component 431 via overwriting of the data value currently stored in the compute component 431 with the data value stored in the corresponding sense amplifier 406. Alternatively, a data value may be loaded into a compute component by deactivating the control lines 482, 483, 491, and 492.

Once a data value is loaded into a compute component 431, the "true" data value is separated from the complement data value by the first inverter 487. Shifting data to the right (e.g., to an adjacent compute component 431) can include alternating operation of the first right-shift transistor 481 and the second right-shift transistor 486, for example, via the PHASE 1R and PHASE 2R control signals being periodic signals that go high out of phase from one another (e.g., non-overlapping alternating square waves 180 out of phase). The transistor 490 can be turned on to latch the shifted data value.

An example of shifting data left via the shift register shown in FIG. 4A can include operating control signals 491 and 492 to move a data value one control component to the left through transistors 489 and 490. Data from node ST2 is inverted through inverter 487 to node SF1. Activation of control signal 491 causes the data from node SF1 to move left through transistor 489 to node SF2 of a left-adjacent compute component 431. Data from node SF2 is inverted through inverter 488 to node ST1. Subsequent activation of control signal 492 causes the data from node ST1 to move through transistor 490 left to node ST2, which completes a left shift by one compute component 431. Data can be "bubbled" to the left by repeating the left shift sequence multiple times. Data values can be latched (and prevented from being further shifted) by maintaining the control signal 492 activated.

Embodiments of the present disclosure are not limited to the shifting capability described in association with the compute components 431. For example, a number of embodiments and include shift circuitry in addition to and/or instead of the shift circuitry described in association with a loadable shift register.

The sensing circuitry in FIG. 4A can be operated in several modes to perform logical operations, including a first mode in which a result of the logical operation is initially stored in the sense amplifier 406, and a second mode in which a result of the logical operation is initially stored in the compute component 431. Additionally with respect to the first operating mode, sensing circuitry can be operated in both pre-sensing (e.g., sense amplifiers fired before logical operation control signal active) and post-sensing (e.g., sense amplifiers fired after logical operation control signal active) modes with a result of a logical operation being initially stored in the sense amplifier 406.

In a number of examples, the sense amplifier 406 and the compute component 431 can be in at least one of two states associated with the first mode and the second mode. As used herein, a state of a sense amplifier 406 and/or the compute component 431 describes a transfer of data between the sense amplifier 406 and/or the compute component 431. The state of the sense amplifier 406 and the compute component 431 can also be described as the state of a sensing component. The state of a sensing component can be based on whether the sense amplifier 406 is in an equilibration state or is storing a data value (e.g., logic "0" or logic "1"). For example, a sense amplifier can be configured to be in an initial state, wherein the initial state is one of an equilibration state and a data storage state. An equilibration state includes the sense amplifier 406 being in an equilibration state. A data storage state includes the sense amplifiers 406 storing a data value. As used herein, a data value can be referred to as a bit and/or a digit value. Data can be transferred from a compute component 431 to a sense amplifier 406 in response to enabling a pass gate (e.g., activating the PASS and/or PASS* control signals via the TF 462, TT 452, FT 454, and/or FF 464 control signals that are referred to herein as a logical operation selection logic) and the sense amplifier 406 being in a equilibration state. Data can be transferred from a sense amplifier 406 to a compute component 431 in response to enabling the pass gate (e.g., activating the PASS and/or PASS* control signals via the TF 462, TT 452, FT 454, and/or FF 464 control signals that are referred to herein as a logical operation selection logic) and the sense amplifier 406 being in a data storage state. The direction of the transfer of data between the sense amplifier 406 and the compute component 431 is determined by whether the sense amplifier 406 is in an equilibration state or stores a data value before the PASS and/or PASS* control signals are activated and by a particular operation selected via the logical operation selection logic (e.g., TF 462, TT 452, FT 454, and FF 464 control signals).

For example, if the sense amplifier 406 is equilibrated and the PASS and/or PASS* control signals are activated to provide a conduction path (e.g., electrical continuity) between the sense amplifier 406 and the compute component 431, then a data value stored in the compute component 431 can be transferred from the compute component 431 to the sense amplifier 406.

If the sense amplifier 406 is configured to store a first bit (e.g., first data value) and the PASS and/or PASS* control signals are activated to provide a conduction path between the sense amplifier 406 and the compute component 431, then a second bit (e.g., second data value) that is stored in the compute component 431 before the activation of the PASS and/or PASS* control signals can be replaced by the first bit and the sense amplifier 406 retains the first bit. Furthermore, a number of operations can be performed using the first bit and the second bit using the logical operation selection logic and the result of the operation can be stored in the compute component 431.

Using an equilibration signal to direct the transfer of data between the sense amplifier 406 and the compute component 431 can provide the ability to selectively perform an operation in sense amplifiers that are not equilibrated without performing the operation in sense amplifiers that are equilibrated. For example, a PASS and/or a PASS* control signal can be activated in a plurality of sensing components to move data between a first group of a plurality of sense amplifiers that are equilibrated and a first group of a plurality of compute components. The PASS and/or PASS* control signals can also be activated to move data between a second group of the plurality of sense amplifiers and a second group of the plurality of component components that are not equilibrated to selectively perform an operation in a second group of sense components while not performing the operation on a first group of sense components.

FIG. 4B is a logic table illustrating selectable logic operation results implemented by a sensing circuitry in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 406 and compute component 431. The four control signals, in conjunction with a particular data value present on the complementary sense lines, controls the state (conducting or not conducting) of the pass gates 407-1 and 407-2 and swap transistors 442, which in turn affects the data value in the compute component 231 and/or sense amplifier 406 before/after firing. The capability to selectably control the state of the swap transistors 442 facilitates implementing logical operations involving inverse data values (e.g., inverse operands and/or inverse result), among others.

Logic Table 413-1 illustrated in FIG. 4B shows the starting data value stored in the compute component 431 in FIG. 4A shown in column A at 444, and the starting data value stored in the sense amplifier 406 shown in column B at 445. The other 3 column headings in Logic Table 413-1 refer to the state of the pass gates 407-1 and 407-2, and the swap transistors 442, which can respectively be controlled to be OPEN (e.g., conducting/on) or CLOSED (e.g., not conducting/off) depending on the state of the four logic selection control signals (e.g., TF, TT, FT, and FF), in conjunction with a particular data value present on the pair of complementary sense lines 405-1 and 405-2 when the ISO control signal is asserted. The "Not Open" column corresponds to the pass gates 407-1 and 407-2 and the swap transistors 442 both being in a non-conducting condition, the "Open True" corresponds to the pass gates 407-1 and 407-2 being in a conducting condition, and the "Open Invert" corresponds to the swap transistors 442 being in a conducting condition. The configuration corresponding to the pass gates 407-1 and 407-2 and the swap transistors 442 both being in a conducting condition is not reflected in Logic Table 413-1 since this results in the sense lines being shorted together.

The logic tables illustrated in FIG. 4B reflect a result initially stored in the compute component 431 in FIG. 4A. Therefore, when the pass gates 407-1 and 407-2 are controlled to be CLOSED (e.g., not conducting), the result initially stored in the compute component 431 is the same as the starting data value in the compute component 431. However, since the sense sensing circuitry 450 is configured such that the sense amplifier 406 can overpower the compute component 431 as shown in the "Not Open" column 456 of the Logic Table 413-1, the result initially stored in the compute component 431 is the same as the starting data value in the sense amplifier 406 when the pass gates 407-1 and 407-2 are controlled to be OPEN (e.g., conducting) as shown in the "Open True" column 470 of the Logic Table 413-1. The compute component 431 can be inverted as shown in the "Open Invert" column 471 when the swap transistors 442 are in a conducting condition.

Via selective control of the state of the pass gates 407-1 and 407-2 and the swap transistors 442, each of the three columns of the upper portion of Logic Table 413-1 can be combined with each of the three columns of the lower portion of Logic Table 413-1 to provide 3×3=9 different result combinations, corresponding to nine different logical operations, as indicated by the various connecting paths shown at 475. The nine different selectable logical operations that can be implemented by the sensing circuitry 450 are summarized in Logic Table 413-2 illustrated in FIG. 4B.

The columns of Logic Table 413-2 illustrated in FIG. 4B show a heading 480 that includes the state of logic selection control signals. For example, the state of a first logic selection control signal is provided in row 476, the state of a second logic selection control signal is provided in row 477, the state of a third logic selection control signal is provided in row 478, and the state of a fourth logic selection control signal is provided in row 479. The particular logical operation corresponding to the results is summarized in row 447.

For example, the results for the values of FF, FT, TF, and TT of "0000" are summarized as "A" since the result (initially stored in the compute component after the sense amplifier fires) is the same as the starting value in the compute component. Other columns of results are similarly annotated in row 447, where "A*B" intends A AND B, "A+B" intends A OR B, and "AXB" intends A XOR B. By convention, a bar over a data value or a logical operation indicates an inverted value of the quantity shown under the bar. For example, AXB bar intends not A XOR B, which is also A XNOR B.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   receiving a plurality of bytes in a little-endian bytewise, big-endian bitwise format such that the plurality of bytes are in a sequential format and the bits in each byte of the plurality of bytes are in a non-bit-sequential format; and
   reordering, using reordering circuitry comprising multiplexers, the bits in each byte of the plurality of bytes on a bytewise basis, without regard to a number of the bytes of the plurality of bytes and as each byte is received from a processor, such that the bits in each byte of the plurality of bytes are arranged in a bit-sequential format.

2. The method of claim 1, wherein the bit-sequential format is a bit-sequential little endian format where the bits are arranged from a least significant bit of each byte of the plurality of bytes being stored in a most significant position and a most significant bit of each byte of the plurality of bytes being stored in a least significant position.

3. The method of claim 1, wherein the plurality of bytes are received at a memory device.

4. The method of claim 1, wherein the plurality of bytes stored in the memory cells are stored in memory cells coupled to a same access line of the array.

5. The method of claim 1, further comprising:
   storing each of the bits in one of a respective number of compute components; and
   shifting each of the bits from a compute component coupled to a memory cell storing a lesser significant bit to a compute component coupled to a memory cell storing a more significant bit.

6. The method of claim 1, further comprising:
   storing each of the bits in one of a respective number of compute components; and
   shifting each of the bits from a compute component coupled to a memory cell storing a more significant bit to a compute component coupled to a memory cell storing a lesser significant bit.

7. The method of claim 1, comprising reordering the bits from a bit-sequential little endian format to a non-bit-sequential little endian format on a byte-by-byte basis after shifting the bits.

8. The method of claim 7, comprising sending the reordered bits to a processing resource.

9. The method of claim 1, wherein reordering the bits in each byte comprises reordering a most significant bit of a first byte from a most significant bit position to a least significant bit position.

10. The method of claim 9, wherein reordering the bits in each byte comprises-reordering a least significant bit of the first byte from a least significant bit position to the most significant bit position.

11. A method, comprising:
    receiving, at reordering circuitry, a plurality of bytes in a bytewise little endian bitwise big endian format such that the plurality of bytes are in a sequential format and the bits in each byte of the plurality of bytes are in a non-bit-sequential format, wherein the reordering circuitry comprises an engine within a controller of a memory device; and
    using the reordering circuitry to reorder the plurality of bytes on a bytewise basis, without regard to a number of the bytes of the plurality of bytes and as each byte is received from a processor, into a bit-sequential little endian format.

12. The method of claim 11, further comprising using the reordering circuitry to reverse an order of the bits of the plurality of bytes stored in the group of memory cells in the bit-sequential little endian format, such that the plurality of bytes are in the bytewise little endian bitwise big endian format.

13. The method of claim 12, further comprising providing the plurality of bytes in the bytewise little endian bitwise big endian format.

14. The method of claim 11, wherein a first bit position in the order of bits in each of a plurality of bytes is a most significant bit position and an eighth bit position in the order is a least significant bit position.

15. The method of claim 11, wherein the bits are ordered in the bit-sequential little endian format, prior to the reversing, such that a most significant bit of a first byte of the plurality of bytes is in a least significant bit position of the first byte.

16. The method of claim 15, wherein the bits are ordered in the bit-sequential little endian format, prior to the reversing, such that a least significant bit of the first byte is in a most significant bit position of the first byte.

17. The method of claim 16, wherein the reversed bits are ordered in the bytewise little endian format such that:
    a most significant bit of the first byte is in a most significant bit position of the first byte; and
    a least significant bit of the first byte is in a least significant bit position of the first byte.

18. A system comprising:
    a host configured to send bits of a plurality of bytes in a bytewise little endian, bitwise big endian format such that the corresponding bits in each byte are in a non-sequential format;
    a memory device comprising reordering circuitry, wherein the memory device is configured to receive the bits of the plurality of bytes and reorder the bits to a bytewise little endian, bitwise little endian format, without regard to a number of the bytes of the plurality of bytes and as each byte is received by the memory device, using multiplexers of the reordering circuitry;
    wherein the corresponding reordered bits in each byte are in a sequential format on a bytewise basis and without regard to a number of bytes of the plurality of bytes.

19. The system of claim 18, wherein the memory device further comprises reordering circuitry,
    wherein the reordering circuitry is configured to reverse an order of the bits of the plurality of bytes in the bytewise little endian, bitwise little endian format stored in a group of memory cells of the memory array, such that the plurality of bytes are in the bytewise little endian, bitwise big endian format.

20. The system of claim 18, wherein the memory device is further configured to:
reorder the reordered bits back to the bytewise little endian, bitwise big endian format; and
send the re-reordered bits to the host.

* * * * *